(12) United States Patent
Daley

(10) Patent No.: US 7,968,927 B2
(45) Date of Patent: Jun. 28, 2011

(54) MEMORY ARRAY FOR INCREASED BIT DENSITY AND METHOD OF FORMING THE SAME

(75) Inventor: Jon Daley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/659,612

(22) Filed: Mar. 15, 2010

(65) Prior Publication Data
US 2010/0171091 A1 Jul. 8, 2010

Related U.S. Application Data

(62) Division of application No. 11/585,795, filed on Oct. 25, 2006, now Pat. No. 7,700,422, which is a division of application No. 11/111,836, filed on Apr. 22, 2005, now Pat. No. 7,427,770.

(51) Int. Cl.
*H01L 27/108* (2006.01)

(52) U.S. Cl. .. 257/300; 257/260; 257/261; 257/E27.104

(58) Field of Classification Search .......... 257/260–261, 257/255, 300, E27.104
See application file for complete search history.

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |

(Continued)

FOREIGN PATENT DOCUMENTS

EP 1 351 253 A1 10/2003

(Continued)

OTHER PUBLICATIONS

Abdel-All, A.; Elshafie,A.; Elhawary, M.M., DC Electric-field Effect in Bulk and Thin-film Ge5As38Te57 Chalcogenide Glass, Vacuum 59 (2000) 845-853.

Adler, D.; Moss, S.C., Amorphous Memories and Bistable Switches, J. Vac. Sci. Technol. 9 (1972) 1182-1189.

Adler, D.; Henisch, H.K.; Mott, S.N., The Mechanism of Threshold Switching in Amorphous Alloys, Rev. Mod. Phys. 50 (1978) 209-220.

Afifi, M.A.; Labib, H.H.; El-Fazary, M.H.; Fadel, M., Electrical and Thermal Properties of Chalcogenide Glass System Se75Ge25-xSbx, Appl. Phys. A 55 (1992) 167-169.

(Continued)

*Primary Examiner* — Hoai V Pham
*Assistant Examiner* — Elias Ullah
(74) *Attorney, Agent, or Firm* — Dickstein Shapiro LLP

(57) ABSTRACT

A memory array having a plurality of resistance variable memory units and method for forming the same are provided. Each memory unit includes a first electrode, a resistance variable material over the first electrode, and a first second-electrode over the resistance variable material. The first second-electrode is associated with the first electrode to define a first memory element. Each memory unit further includes a second second-electrode over the resistance variable material. The second-second electrode is associated with the first electrode to define a second memory element.

19 Claims, 11 Drawing Sheets

U.S. PATENT DOCUMENTS

| | | |
|---|---|---|
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolsteinholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B2 | 1/2003 | Hudgens et al. |
| 6,511,867 B2 | 1/2003 | Lowery et al. |
| 6,512,241 B1 | 1/2003 | Lai |
| 6,514,805 B2 | 2/2003 | Xu et al. |
| 6,531,373 B2 | 3/2003 | Gill et al. |
| 6,534,781 B2 | 3/2003 | Dennison |
| 6,545,287 B2 | 4/2003 | Chiang |
| 6,545,907 B1 | 4/2003 | Lowery et al. |
| 6,555,860 B2 | 4/2003 | Lowery et al. |
| 6,563,164 B2 | 5/2003 | Lowery et al. |
| 6,566,700 B2 | 5/2003 | Xu |
| 6,567,293 B1 | 5/2003 | Lowery et al. |
| 6,569,705 B2 | 5/2003 | Chiang et al. |
| 6,570,784 B2 | 5/2003 | Lowery |
| 6,576,921 B2 | 6/2003 | Lowery |
| 6,586,761 B2 | 7/2003 | Lowery |
| 6,589,714 B2 | 7/2003 | Maimon et al. |
| 6,590,807 B2 | 7/2003 | Lowery |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,613,604 B2 | 9/2003 | Maimon et al. |
| 6,621,095 B2 | 9/2003 | Chiang et al. |
| 6,625,054 B2 | 9/2003 | Lowery et al. |
| 6,635,914 B2 | 10/2003 | Kozicki et al. |
| 6,638,820 B2 | 10/2003 | Moore |
| 6,642,102 B2 | 11/2003 | Xu |
| 6,646,297 B2 | 11/2003 | Dennison |
| 6,649,928 B2 | 11/2003 | Dennison |
| 6,667,900 B2 | 12/2003 | Lowery et al. |
| 6,671,710 B2 | 12/2003 | Ovshinsky et al. |
| 6,673,648 B2 | 1/2004 | Lowery |
| 6,673,700 B2 | 1/2004 | Dennison et al. |
| 6,674,115 B2 | 1/2004 | Hudgens et al. |
| 6,687,153 B2 | 2/2004 | Lowery |
| 6,687,427 B2 | 2/2004 | Ramalingam et al. |
| 6,690,026 B2 | 2/2004 | Peterson |
| 6,696,355 B2 | 2/2004 | Dennison |
| 6,707,712 B2 | 3/2004 | Lowery |
| 6,714,954 B2 | 3/2004 | Ovshinsky et al. |
| 6,855,975 B2 | 2/2005 | Gilton |
| 6,867,114 B2 | 3/2005 | Moore et al. |
| 6,867,996 B2 | 3/2005 | Campbell et al. |
| 6,870,751 B2 | 3/2005 | Van Brocklin et al. |

| | | |
|---|---|---|
| 6,894,304 B2 | 5/2005 | Moore |
| 6,969,633 B2 | 11/2005 | Dennison |
| 7,057,923 B2 | 6/2006 | Furkay et al. |
| 7,071,485 B2 | 7/2006 | Takaura et al. |
| 7,208,751 B2 | 4/2007 | Ooishi |
| 7,214,958 B2 | 5/2007 | Happ |
| 7,262,427 B2 * | 8/2007 | Lee et al. ............... 257/3 |
| 7,427,770 B2 | 9/2008 | Daley |
| 7,442,602 B2 | 10/2008 | Park et al. |
| 7,560,723 B2 | 7/2009 | Liu |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield |
| 2002/0190289 A1 | 12/2002 | Harshfield et al. |
| 2002/0190350 A1 | 12/2002 | Kozicki et al. |
| 2003/0001229 A1 | 1/2003 | Moore et al. |
| 2003/0001230 A1 | 1/2003 | Lowrey |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li et al. |
| 2003/0068862 A1 | 4/2003 | Li et al. |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156452 A1 | 8/2003 | Gilton |
| 2003/0156463 A1 | 8/2003 | Casper et al. |
| 2003/0201469 A1 | 10/2003 | Lowrey |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |
| 2004/0202016 A1 * | 10/2004 | Campbell ............... 365/159 |
| 2005/0074933 A1 | 4/2005 | Lowrey |
| 2005/0122757 A1 | 6/2005 | Moore et al. |
| 2005/0180189 A1 | 8/2005 | Happ et al. |
| 2005/0287698 A1 | 12/2005 | Li et al. |
| 2006/0049390 A1 | 3/2006 | Ufert et al. |
| 2006/0110878 A1 | 5/2006 | Lung et al. |
| 2006/0125108 A1 | 6/2006 | Gutsche et al. |
| 2006/0175640 A1 | 8/2006 | Happ et al. |
| 2006/0240616 A1 | 10/2006 | Daley |
| 2007/0059882 A1 | 3/2007 | Daley |
| 2007/0121369 A1 | 5/2007 | Happ |
| 2007/0232015 A1 | 10/2007 | Liu |
| 2009/0261316 A1 | 10/2009 | Liu |

FOREIGN PATENT DOCUMENTS

| | | |
|---|---|---|
| JP | 5-6126916 | 10/1981 |
| WO | WO 97/48032 | 12/1997 |
| WO | WO 99/21235 | 4/1999 |
| WO | WO 99/28914 | 6/1999 |
| WO | WO 00/48196 | 8/2000 |
| WO | WO 02/21542 | 3/2002 |
| WO | WO 2005/117026 A1 | 12/2005 |

OTHER PUBLICATIONS

Afifi, M.A.; Labib, H.H.; Fouad, S.S.; El-Shazly, A.A., Electrical & Thermal Conductivity of the Amorphous Semiconductor $Ge_xSe_{1-x}$, Egypt, J. Phys. 17 (1986) 335-342.

Alekperova, Sh.M.; Gadzhieva, G.S., Current-voltage Characteristics of $Ag_2Se$ Single Crystal Near the Phase Transition, Inorganic Materials 23 (1987) 137-139.

Aleksiejunas, A.; Cesnys, A., Switching Phenomenon and Memory Effect in Thin-film Heterojunction of Polycrystalline Selenium-silver Selenide, Phys. Stat. Sol. (a) 19 (1973) K169-K171.

Angell, C.A., Mobile Ions in Amorphous Solids, Annu. Rev. Phys. Chem. 43 (1992) 693-717.

Aniya, M., Average Electronegativity, Medium-range-order, and Ionic Conductivity in Superionic Glasses, Solid State Ionics 136-137 (2000) 1085-1089.

Asahara, Y.; Izumitani, T., Voltage Controlled Switching in Cu-As-Se Compositions, J. Non-Cryst. Solids 11 (1972) 97-104.

Asokan, S.; Prasad, M.V.N.; Parthasarathy, G.; Gopal, E.S.R., Mechanical and Chemical Thresholds in IV-VI Chalcogenide Glasses, Phys. Rev. Lett. 62 (1989) 808-810.

Axon Technologies Corporation, Technology Description: *Programmable Metalization Cell (PMC)*, pp. 1-6 (pre-May 2000).

Baranovskii, S.D.; Cordes, H., On the Conduction Mechanism in Ionic Glasses, J. Chem. Phys. 111 (1999) 7546-7557.

Belin, R.; Taillades, G.; Pradel, A.; Ribes, M., Ion Dynamics in Superionic Chalcogenide Glasses: CompleteConductivity Spectra, Solid State Ionics 136-137 (2000) 1025-1029.

Belin, R.; Zerouale, A.; Pradel, A.; Ribes, M., Ion Dynamics in the Argyrodite Compound $Ag_7GeSe_5I$: Non-Arrhenius Behavior and Complete Conductivity Spectra, Solid State Ionics 143 (2001) 445-455.

Benmore, C.J.; Salmon, P.S., Structure of Fast Ion Conducting and Semiconducting Glassy Chalcogenide Alloys, Phys. Rev. Lett. 73 (1994) 264-267.

Bernede, J.C., Influence Du Metal Des Electrodes Sur Les Caracteristiques Courant-tension Des Structures $M-Ag_2Se-M$, Thin Solid Films 70 (1980) L1-L4.

Bernede, J.C., Polarized Memory Switching in MIS Thin Films, Thin Solid Films 81 (1981) 155-160.

Bernede, J.C., Switching and Silver Movements in $Ag_2Se$ Thin Films, Phys. Stat. Sol. (a) 57 (1980) K101-K104.

Bernede, J.C.; Abachi, T., Differential Negative Resistance in Metal/insulator/metal Structures with an Upper Bilayer Electrode, Thin Solid Films 131 (1985) L61-L64.

Bernede, J.C.; Conan, A.; Fousenan't, E.; El Bouchairi, B.; Goureaux, G., Polarized Memory Switching Effects in $Ag_2Se/Se/M$ Thin Film Sandwiches, Thin Solid Films 97 (1982) 165-171.

Bernede, J.C.; Khelil, A.; Kettaf, M.; Conan, A., Transition from S- to N-type Differential Negative Resistance in $Al-Al_2O_3-Ag_{2-x}Se_{1+x}$ Thin Film Structures, Phys. Stat. Sol. (a) 74 (1982) 217-224.

Bondarev, V.N.; Pikhitsa, P.V., A Dendrite Model of Current Instability in $RbAg_4I_5$, Solid State Ionics 70/71 (1994) 72-76.

Boolchand, P., The Maximum in Glass Transition Temperature (Tg) Near $x=\frac{1}{3}$ in $Ge_xSe_{1-x}$ Glasses, Asian Journal of Physics (2000) 9, 709-72.

Boolchand, P.; Bresser, W.J., Mobile Silver Ions and Glass Formation in Solid Electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of Rigidity in Steps in Chalcogenide Glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural Ordering of Evaporated Amorphous Chalcogenide Alloy Ffilms: Role of Thermal Annealing, Diffusion and Defect Data vol. 53-54 (1987) 415-420.

Boolchand, P.; Grothaus, J.; Bresser, W.J.; Suranyi, P., Structural Origin of Broken Chemical Order in a GeSe2 glass, Phys. Rev. B 25 (1982) 2975-2978.

Boolchand, P.; Grothaus, J.; Phillips, J.C., Broken Chemical Order and Phase Separation in GexSe1−x Glasses, Solid State Comm. 45 (1983) 183-185.

Boolchand, P.; Bresser, W.J., Compositional Trends in Glass Transition Temperature (Tg), Network Connectivity and Nanoscale Chemical Phase Separation in Chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 Glasses Compared, Proc. Int. Conf. Phys. Semicond. (Eds. Chadi and Harrison) $17^{th}$ (1985) 833-36.

Bresser, W.; Boolchand, P.; Suranyi, P., Rigidity Percolation and Molecular Clustering in Network Glasses, Phys. Rev. Lett. 56 (1986) 2493-2496.

Bresser, W.J.; Boolchand, P.; Suranyi, P.; de Neufville, J.P, Intrinsically Broken Chalcogen Chemical Order in Stoichiometric Glasses, Journal de Physique 42 (1981) C4-193-C4-196.

Bresser, W.J.; Boolchand, P.; Suranyi, P.; Hernandez, J.G., Molecular Phase Separation and Cluster Size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-temperature, Electric Field Induced Creation of Stable Devices in CuInSe2 Crystals, Science 258 (1992) 271-274.

Chatterjee, R.; Asokan, S.; Titus, S.S.K., Current-controlled Negative-resistance Behavior and Memory Switching in Bulk As-Te-Se Glasses, J. Phys. D: Appl. Phys. 27 (1994) 2624-2627.

Chen, C.H.; Tai, K.L., Whisker Growth Induced by Ag Photodoping in Glassy GexSe1−x Films, Appl. Phys. Lett. 37 (1980) 1075-1077.

Chen, G.; Cheng, J., Role of Nitrogen in the Crystallization of Silicon Nitride-doped Chalcogenide Glasses, J: Am. Ceram. Soc. 82 (1999) 2934-2936.

Chen, G.; Cheng, J.; Chen, W., Effect of Si3N4 on Chemical Durability of Chalcogenide Glass, J. Non-Cryst. Solids 220 (1997) 249-253.

Cohen, M.H.; Neale, R.G.; Paskin, A., A Model for an Amorphous Semiconductor Memory Device, J. Non-Cryst. Solids 8-10 (1972) 885-891.

Croitoru, N.; Lazarescu, M.; Popescu, C.; Telnic, M.; and Vescan, L., Ohmic and Non-ohmic Conduction in Some Amorphous Semiconductors, J. Non-Cryst. Solids 8-10 (1972) 781-786.

Dalven, R.; Gill, R., Electrical Properties of Beta-Ag2Te and Beta-Ag2Se From 4.2° to 300° K, J. Appl. Phys. 38 (1967) 753-756.

Davis, E.A., Semiconductors Without Form, Search 1 (1970) 152-155.

Dearnaley, G.; Stoneham, A.M.; Morgan, D.V., Electrical Phenomena in Amorphous Oxide Films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold Switching in Hydrogenated Amorphous Silicon, Appl. Phys. Lett. 40 (1982) 812-813.

Drusedau, T.P.; Panckow, A.N.; Klabunde, F., The Hydrogenated Amorphous Silicon/nanodisperse Metal (SIMAL) System-Films of Unique Electronic Properties, J. Non-Cryst. Solids 198-200 (1996) 829-832.

El Bouchairi, B.; Bernede, J.C.; Burgaud, P., Properties of Ag2-xSe1+x/n-Si Diodes, Thin Solid Films 110 (1983) 107-113.

El Gharras, Z.; Bourahla, A.; Vautier, C., Role of Photoinduced Defects in Amorphous GexSe1-x Photoconductivity, J. Non-Cryst. Solids 155 (1993) 171-179.

El Ghrandi, R.; Calas, J.; Galibert, G.; Averous, M., Silver Photodissolution in Amorphous Chalcogenide Tthin Films, Thin Solid Films 218 (1992) 259-273.

El Ghrandi, R.; Calas, J.; Galibert, G., Ag Dissolution Kinetics in Amorphous GeSe5.5 Thin Films from "In-situ" Resistance Measurements vs. Time, Phys. Stat. Sol. (a) 123 (1991) 451-460.

El-kady, Y.L., The Threshold Switching in Semiconducting Glass Ge21Se17Te62, Indian J. Phys. 70A (1996) 507-516.

Elliott, S.R., A Unified Mechanism for Metal Photodissolution in Amorphous Chalcogenide Materials, J. Non-Cryst. Solids 130 (1991) 85-97.

Elliott, S.R., Photodissolution of Metals in Chalcogenide Glasses: A Unified Mechanism, J. Non-Cryst. Solids 137-138 (1991) 1031-1034.

Elsamanoudy, M.M.; Hegab, N.A.; Fadel, M., Conduction Mechanism in the Pre-switching State of Thin Films Containing Te As Ge Si, Vacuum 46 (1995) 701-707.

El-Zahed, H.; El-Korashy, A., Influence of Composition on the Electrical and Optical Properties of Ge20BixSe80-x Films, Thin Solid Films 376 (2000) 236-240.

Fadel, M., Switching Phenomenon in Evaporated Se-Ge-As Thin Films of Amorphous Chalcogenide Glass, Vacuum 44 (1993) 851-855.

Fadel, M.; El-Shair, H.T., Electrical, Thermal and Optical Properties of Se75Ge7Sb18, Vacuum 43 (1992) 253-257.

Feng, X. Bresser, W.J.; Boolchand, P., Direct Evidence for Stiffness Threshold in Chalcogenide Glasses, Phys. Rev. Lett. 78 (1997) 4422-4425.

Feng, X. Bresser, W.J.; Zhang, M.; Goodman, B.; Boolchand, P., Role of Network Connectivity on the Elastic, Plastic and Thermal Behavior of Covalent Glasses, J. Non-Cryst. Solids 222 (1997) 137-143.

Fischer-Colbrie, A.; Bienenstock, A.; Fuoss, P.H.; Marcus, M.A., Structure and Bonding in Photodiffused Amorphous Ag-GeSe2 Thin Films, Phys. Rev. B 38 (1988) 12388-12403.

Fleury, G.; Hamou, A.; Viger, C.; Vautier, C., Conductivity and Crystallization of Amorphous Selenium, Phys. Stat. Sol. (a) 64 (1981) 311-316.

Fritzsche, H, Optical and Electrical Energy Gaps in Amorphous Semiconductors, J. Non-Cryst. Solids 6 (1971) 49-71.

Fritzsche, H., Electronic Phenomena in Amorphous Semiconductors, Annual Review of Materials Science 2 (1972) 697-744.

Gates, B.; Wu, Y.; Yin, Y.; Yang, P.; Xia, Y., Single-crystalline Nanowires of Ag2Se can be Synthesized by Templating Against Nanowires of Ttrigonal Se, J. Am. Chem. Soc. (2001) currently ASAP.

Gosain, D.P.; Nakamura, M.; Shimizu, T.; Suzuki, M.; Okano, S., Nonvolatile Memory Based on Reversible Phase Transition Phenomena in Telluride Glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation Creep of Ge-Se Chalcogenide Glasses Below Tg: Elastic Recovery and Non-Newtonian Flow, J. Non-Cryst. Solids 298 (2002) 260-269.

Guin, J.-P.; Rouxel, T.; Sangleboeuf, J.-C; Melscoet, I.; Lucas, J., Hardness, Toughness, and Scratchability of Germanium-selenium Chalcogenide Glasses, J. Am. Ceram. Soc. 85 (2002) 1545-52.

Gupta, Y.P., On Electrical Switching and Memory Effects in Amorphous Chalcogenides, J. Non-Cryst. Sol. 3 (1970) 148-154.

Haberland, D.R.; Stiegler, H., New Experiments on the Charge-controlled Switching Effect in Amorphous Semiconductors, J. Non-Cryst. Solids 8-10 (1972) 408-414.

Haifz, M.M.; Ibrahim, M.M.; Dongol, M.; Hammad, F.H., Effect of Composition on the Structure and Electrical Properties of As-Se-Cu Glasses, J. Apply. Phys. 54 (1983) 1950-1954.

Hajto, J.; Rose, M.J.; Osborne, I.S.; Snell, A.J.; Le Comber, P.G.; Owen, A.E., Quantization Effects in Metal/a-Si:H/metal Devices, Int. J. Electronics 73 (1992) 911-913.

Hajto, J.; Hu, J.; Snell, A.J.; Turvey, K.; Rose, M., DC and AC Measurements on Metal/a-Si:H/metal Room Temperature Quantised Resistance Devices, J. Non-Cryst. Solids 266-269 (2000) 1058-1061.

Hajto, J.; McAuley, B.; Snell, A.J.; Owen, A.E., Theory of Room Temperature Quantized Resistance Effects in Metal-a-Si:H-metal Thin Film Structures, J. Non-Cryst. Solids 198-200 (1996) 825-828.

Hajto, J.; Owen, A.E.; Snell, A.J.; Le Comber, P.G.; Rose, M.J., Analogue Memory and Ballistic Electron Effects in Metal-amorphous Silicon Structures, Phil. Mag. B 63 (1991) 349-369.

Hayashi, T.; Ono, Y.; Fukaya, M.; Kan, H., Polarized Memory Switching in Amorphous Se Film, Japan. J. Appl. Phys. 13 (1974) 1163-1164.

Hegab, N.A.; Fadel, M.; Sedeek, K., Memory Switching Phenomena in Thin Films of Chalcogenide Semiconductors, Vacuum 45 (1994) 459-462.

Helbert et al., *Intralevel Hybrid Resist Process with Submicron Capability*, SPIE vol. 333 Submicron Lithography, pp. 24-29 (1982).

Hilt, Dissertation: *Materials Characterization of Silver Chalcogenide Programmable Metalization Cells*, Arizona State University, pp. Title page-114 (UMI Company, May 1999).

Hirose et al., *High Speed Memory Behavior and Reliability of an Amorphous $As_2S_3$ Film Doped with Ag*, Phys. Stat. Sol. (a) 61, pp. 87-90 (1980).

Hirose, Y.; Hirose, H., Polarity-dependent Memory Switching and Behavior of Ag Dendrite in Ag-photodoped Amorphous As2S3 Films, J. Appl. Phys. 47 (1976) 2767-2772.

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Hong, K.S.; Speyer, R.F., Switching Behavior in II-IV-V2 Amorphous Semiconductor Systems, J. Non-Cryst. Solids 116 (1990) 191-200.

Hosokawa, S., Atomic and Electronic Structures of Glassy GexSe1-x Around the Stiffness Threshold Composition, J. Optoelectronics and Advanced Materials 3 (2001) 199-214.

Hu, J.; Snell, A.J.; Hajto, J.; Owen, A.E., Constant Current Forming in Cr/p+a-Si:H/V Thin Film Devices, J. Non-Cryst. Solids 227-230 (1998) 1187-1191.

Hu, J.; Hajto, J.; Snell, A.J.; Owen, A.E.; Rose, M.J., Capacitance Anomaly Near the Metal-Non-metal Transition in Cr-hydrogenated Amorphous Si-V Thin-film Devices, Phil. Mag. B. 74 (1996) 37-50.

Hu, J.; Snell, A.J.; Hajto, J.; Owen, A.E., Current-induced Instability in Cr-p+a-Si:H-V Thin Film Devices, Phil. Mag. B 80 (2000) 29-43.

Huggett et al., Development of Silver Sensitized Germanium Selenide Photoresist by Reactive Sputter Etching in SF6, 42 Appl. Phys. Lett., No. 7, pp. 592-594 (Apr. 1983).

Iizima, S.; Sugi, M.; Kikuchi, M.; Tanaka, K., Electrical and Thermal Properties of Semiconducting Glasses As-Te-Ge, Solid State Comm. 8 (1970) 153-155.

Ishikawa, R.; Kikuchi, M., Photovoltaic Study on the Photo-enhanced Diffusion of Ag in Amorphous Films of Ge2S3, J. Non-Cryst. Solids 35 & 36 (1980) 1061-1066.

Iyetomi, H.; Vashishta, P.; Kalia, R.K., Incipient Phase Separation in Ag/Ge/Se Glasses: Clustering of Ag Atoms, J. Non-Cryst. Solids 262 (2000) 135-142.

Jones, G.; Collins, R.A., Switching Properties of Thin Selenium Films Under Pulsed Bias, Thin Solid Films 40 (1977) L15-L18.

Joullie, A.M.; Marucchi, J., On the DC Electrical Conduction of Amorphous As2Se7 Before Switching, Phys. Stat. Sol. (a) 13 (1972) K105-K109.

Joullie, A.M.; Marucchi, J., Electrical Properties of the Amorphous Alloy As2Se5, Mat. Res. Bull. 8 (1973) 433-441.

Kaplan, T.; Adler, D., Electrothermal Switching in Amorphous Semiconductors, J. Non-Cryst. Solids 8-10 (1972) 538-543.

Kawaguchi et al., *Mechanism of Photosurface Deposition*, 164-166 J. Non-Cryst. Solids, pp. 1231-1234 (1993).

Kawaguchi, T.; Maruno, S.; Elliott, S.R., Optical, Electrical, and Structural Properties of Amorphous Ag-Ge-S and Ag-Ge-Se Films and Comparison of Photoinduced and Thermally Induced Phenomena of Both Systems, J. Appl. Phys. 79 (1996) 9096-9104.

Kawaguchi, T.; Masui, K., Analysis of Change in Optical Ttransmission Spectra Resulting from Ag Photodoping in Chalcogenide Film, Japn. J. Appl. Phys. 26 (1987) 15-21.

Kawamoto, Y., Nishida, M., Ionic Condition in As2S3—Ag2S, GeS2—GeS—Ag2S and P2S5-Ag2S Glasses, J. Non-Cryst Solids 20 (1976) 393-404.

Kawasaki, M.; Kawamura, J.; Nakamura, Y.; Aniya, M., Ionic Conductivity of Agx(GeSe3)1-x (0<=x<=0.571) Glasses, Solid State Ionics 123 (1999) 259-269.

Kluge, G.; Thomas, A.; Klabes, R.; Grotzschel, R., Suptitz, P. Silver Photodiffusion in Amorphous GexSe100-x, J. Non-Cryst. Solids 124 (1990) 186-193.

Kolobov, A.V., On the Origin of P-type Conductivity in Amorphous Chalcogenides, J. Non-Cryst. Solids 198-200 (1996) 728-731.

Kolobov, A.V., Lateral Diffusion of Silver in Vitreous Chalcogenide Films, J. Non-Cryst. Solids 137-138 (1991) 1027-1030.

Kolobov et al., Photodoping of Amorphous Chalcogenides by Metals, Advances in Physics, 1991, vol. 40, No. 5, pp. 625-684.

Korkinova, Ts.N.; Andreichin, R.E., Chalcogenide Glass Polarization and the Type of Contacts, J. Non-Cryst. Solids 194 (1996) 256-259.

Kotkata, M.F.; Afifi M.A.; Labib, H.H.; Hegab, N.A.; Abdel-Aziz, M.M., Memory Switching in Amorphous GeSeTl Chalcogenide Semiconductor Films, Thin Solid Films 240 (1994) 143-146.

Kozicki et al., Silver Incorporation in Thin Films of Selenium Rich Ge-Se Glasses, International Congress on Glass, vol. 2, Extended Abstracts, Jul. 2001, pp. 8-9.

Michael N. Kozicki, 1. Programmable Metallization Cell Technology Description, Feb. 18, 2000.

Michael N. Kozicki, Axon Technologies Corp. and Arizona State University, Presentation to Micron Technology, Inc., Apr. 6, 2000.

Kozicki et al., Applications of Programmable Resistance Changes in Metal-doped Chalcogenides, Electrochemical Society Proceedings, vol. 99-13, 1999, pp. 298-309.

Kozicki et al., Nanoscale Effects in Devices Based on Chalcogenide Solid Solutions, Superlattices and Microstructures, vol. 27, No. 5/6, 2000, pp. 485-488.

Kozicki et al., Nanoscale Phase Separation in Ag-Ge-Se Glasses, Microelectronic Engineering 63 (2002) pp. 155-159.

Lakshminarayan, K.N.; Srivastava, K.K.; Panwar, O.S.; Kumar, A., Amorphous Semiconductor Devices: Memory and Switching Mechanism, J. Instn Electronics & Telecom. Engrs 27 (1981) 16-19.

Lal, M.; Goyal, N., Chemical Bond Approach to Study the Memory and Threshold Switching Chalcogenide Glasses, Indian Journal of Pure & Appl. Phys. 29 (1991) 303-304.

Leimer, F.; Stotzel, H.; Kottwitz, A., Isothermal Electrical Polarisation of Amorphous GeSe Films with Blocking Al Contacts Influenced by Poole-Frenkel Conduction, Phys. Stat. Sol. (a) 29 (1975) K129-K132.

Leung, W.; Cheung, N.; Neureuther, A.R., Photoinduced Diffusion of Ag in GexSe1-x Glass, Appl. Phys. Lett. 46 (1985) 543-545.

Matsushita, T.; Yamagami, T.; Okuda, M., Polarized Memory Effect Observed on Se-SnO2 System, Jap. J. Appl. Phys. 11 (1972) 1657-1662.

Matsushita, T.; Yamagami, T.; Okuda, M., Polarized Memory Effect Observed on Amorphous Selenium Thin Films, Jpn. J. Appl. Phys. 11 (1972) 606.

Mazurier, F.; Levy, M.; Souquet, J.L, Reversible and Irreversible Electrical Switching in TeO2-V2O5 Based Glasses, Journal de Physique IV 2 (1992) C2-185-C2-188.

McHardy et al., The Dissolution of Metals in Amorphous Chalcogenides and the Effects of Electron and Ultraviolet Radiation, 20 J. Phys. C.: Solid State Phys., pp. 4055-4075 (1987).

Messoussi, R.; Bernede, J.C.; Benhida, S.; Abachi, T.; Latef, A., Electrical Characterization of M/Se Structures (M=Ni,Bi), Mat. Chem. And Phys. 28 (1991) 253-258.

Mitkova, M.; Boolchand, P., Microscopic Origin of the Glass Forming Tendency in Chalcohalides and Constraint Theory, J. Non-Cryst. Solids 240 (1998) 1-21.

Mitkova, M.; Kozicki, M.N., Silver Incorporation in Ge-Se Glasses Used in Programmable Metallization Cell Devices, J. Non-Cryst. Solids 299-302 (2002) 1023-1027.

Mitkova, M.; Wang, Y.; Boolchand, P., Dual Chemical Role of Ag as an Additive in Chalcogenide Glasses, Phys. Rev. Lett. 83 (1999) 3848-3852.

Miyatani, S.-y., Electronic and Ionic Conduction in (AgxCu1-x)2Se, J. Phys. Soc. Japan 34 (1973) 423-432.

Miyatani, S.-y., Electrical Properties of Ag2Se, J. Phys. Soc. Japan 13 (1958) 317.

Miyatani, S.-y., Ionic Conduction in Beta-Ag2Te and Beta-Ag2Se, Journal Phys. Soc. Japan 14 (1959) 996-1002.

Mott, N.F., Conduction in Glasses Containing Transition Metal Ions, J. Non-Cryst. Solids 1 (1968) 1-17.

Nakayama, K.; Kitagawa, T.; Ohmura, M.; Suzuki, M., Nonvolatile Memory Based on Phase Transition in Chalcogenide Thin Films, Jpn. J. Appl. Phys. 32 (1993) 564-569.

Nakayama, K.; Kojima, K.; Hayakawa, F.; Imai, Y.; Kitagawa, A.; Suzuki, M., Submicron Nonvolatile Memory Cell Based on Reversible Phase Transition in Chalcogenide Glasses, Jpn. J. Appl. Phys. 39 (2000) 6157-6161.

Nang, T.T.; Okuda, M.; Matsushita, T.; Yokota, S.; Suzuki, A., Electrical and Optical Properties of GexSe1-x Amorphous Thin Films, Jap. J. App. Phys. 15 (1976) 849-853.

Narayanan, R.A.; Asokan, S.; Kumar, A., Evidence Concerning the Effect of Topology on Electrical Switching in Chalcogenide Network Glasses, Phys. Rev. B 54 (1996) 4413-4415.

Neale, R.G.; Aseltine, J.A., The Application of Amorphous Materials to Computer Memories, IEEE Transactions on Electron Dev. Ed-20 (1973) 195-209.

Ovshinsky S.R.; Fritzsche, H., Reversible Structural Transformations in Amorphous Semiconductors for Memory and Logic, Metalurgical Transactions 2 (1971) 641-645.

Ovshinsky, S.R., Reversible Electrical Switching Phenomena in Disordered Structures, Phys. Rev. Lett. 21 (1968) 1450-1453.

Owen, A.E.; LeComber, P.G.; Sarrabayrouse, G.; Spear, W.E., New Amorphous-silicon Electrically Programmable Nonvolatile Switching Device, IEE Proc. 129 (1982) 51-54.

Owen, A.E.; Firth, A.P.; Ewen, P.J.S., Photo-induced Structural and Physico-chemical Changes in Amorphous Chalcogenide Semiconductors, Phil. Mag. B 52 (1985) 347-362.

Owen, A.E.; Le Comber, P.G.; Hajto, J.; Rose, M.J.; Snell, A.J., Switching in Amorphous Devices, Int. J. Electronics 73 (1992) 897-906.

Owen et al., Metal-Chalcogenide Photoresists for High Resolution Lithography and Sub-Micron Structures, Nanostructure Physics and Fabrication, pp. 447-451 (M. Reed ed. 1989).

Pattanayak, P.; Asokan, S., Signature of a Silver Phase Percolation Threshold in Microscopically Phase Separated Ternary $Ge_{0.15}Se_{0.85-x}Ag_x (0 \leq x \leq 0.20)$ Glasses, J. App. Phys. 97 (published online Dec. 13, 2004).

Pearson, A.D.; Miller, C.E., Filamentary Conduction in Semiconducting Glass Diodes, App. Phys. Lett. 14 (1969) 280-282.

Pinto, R.; Ramanathan, K.V., Electric Field Induced Memory Switching in Thin Films of the Chalcogenide System Ge-As-Se, Appl. Phys. Lett. 19 (1971) 221-223.

Popescu, C., The Effect of Local Non-uniformities on Thermal Switching and High Field Behavior of Structures with Chalcogenide Glasses, Solid-State Electronics 18 (1975) 671-681.

Popescu, C.; Croitoru, N., The Contribution of the Lateral Thermal Instability to the Switching Phenomenon, J. Non-Cryst. Solids 8-10 (1972) 531-537.

Popov, A.I.; Geller, I.K.H.; Shemetova, V.K., Memory and Threshold Switching Effects in Amorphous Selenium, Phys. Stat. Sol. (a) 44 (1977) K71-K73.

Prakash, S.; Asokan, S.; Ghare, D.B., Easily Reversible Memory Switching in Ge-As-Te Glasses, J. Phys. D: Appl. Phys. 29 (1996) 2004-2008.

Rahman, S.; Sivarama Sastry, G., Electronic Switching in Ge-Bi-Se-Te Glasses, Mat. Sci. and Eng. B12 (1992) 219-222.

Ramesh, K.; Asokan, S.; Sangunni, K.S.; Gopal, E.S.R., Electrical Switching in Germanium Telluride Glasses Doped with Cu and Ag, Appl. Phys. A 69 (1999) 421-425.

Rose,M.J.;Hajto,J.;Lecomber,P.G.;Gage,S.M.;Choi,W.K.;Snell, A.J.;Owen,A.E., Amorphous Silicon Analogue Memory Devices, J. Non-Cryst. Solids 115 (1989) 168-170.

Rose,M.J.;Snell,A.J.;Lecomber,P.G.;Hajto,J.;Fitzgerald, A.G.;Owen,A.E., Aspects of Non-volatility in a -Si:H Memory Devices, Mat. Res. Soc. Symp. Proc. V 258, 1992, 1075-1080.

Schuocker, D.; Rieder, G., On the Reliability of Amorphous Chalcogenide Switching Devices, J. Non-Cryst. Solids 29 (1978) 397-407.

Sharma, A.K.; Singh, B., Electrical Conductivity Measurements of Evaporated Selenium Films in Vacuum, Proc. Indian Natn. Sci. Acad. 46, A, (1980) 362-368.

Sharma, R. P., Structural, Electrical and Optical Properties of Silver Selenide Films, Ind. J. of Pure and Applied Phys. 35 (1997) 424-427.

Shimizu et al., *The Photo-Erasable Memory Switching Effect of Ag Photo-Doped Chalcogenide Glasses*, 46 B. Chem Soc. Japan, No. 12, pp. 3662-3665 (1973).

Snell, A.J.; Lecomber, P.G.; Hajto, J.; Rose, M.J.; Owen, A.E.; Osborne, I.S., Analogue Memory Effects in Metal/a-Si:H/metal Memory Devices, J. Non-Cryst. Solids 137-138 (1991) 1257-1262.

Snell, A.J.; Hajto, J.;Rose, M.J.; Osborne, I.S.; Holmes, A.; Owen, A.E.; Gibson, R.A.G., Analogue Memory Effects in Metal/a-Si:H/metal Thin Film Structures, Mat. Res. Soc. Symp. Proc. V 297, 1993, 1017-1021.

Steventon, A.G., Microfilaments in Amorphous Chalcogenide Memory Devices, J. Phys. D: Appl. Phys. 8 (1975) L120-L122.

Steventon, A.G., The Switching Mechanisms in Amorphous Chalcogenide Memory Devices, J. Non-Cryst. Solids 21 (1976) 319-329.

Stocker, H.J., Bulk and Thin Film Switching and Memory Effects in Semiconducting Chalcogenide Glasses, App. Phys. Lett. 15 (1969) 55-57.

Tanaka, K., Ionic and Mixed Conductions in Ag Photodoping Process, Mod. Phys. Lett B 4 (1990) 1373-1377.

Tanaka, K.; Iizima, S.; Sugi, M.; Okada, Y.; Kikuchi, M., Thermal Effect on Switching Phenomenon in Chalcogenide Amorphous Semiconductors, Solid State Comm. 8 (1970) 387-389.

Thornburg, D.D., Memory Switching in a Type I Amorphous Chalcogenide, J. Elect. Mat. 2 (1973) 3-15.

Thornburg, D.D., Memory Switching in Amorphous Arsenic Triselenide, J. Non-Cryst. Solids 11 (1972) 113-120.

Thornburg, D.D.; White, R.M., Electric Field Enhanced Phase Separation and Memory Switching in Amorphous Arsenic Triselenide, Journal (1972) 4609-4612.

Tichy, L.; Ticha, H., Remark on the Glass-forming Ability in GexSe1-x and AsxSe1-x Systems, J. Non-Cryst. Solids 261 (2000) 277-281.

Titus, S.S.K.; Chatterjee, R.; Asokan, S., Electrical Switching and Short-range Order in As-Te Glasses, Phys. Rev. B 48 (1993) 14650-14652.

Tranchant,S.;Peytavin,S.;Ribes,M.;Flank,A.M.;Dexpert,H.; Lagarde,J.P., Silver Chalcogenide Glasses Ag-Ge-Se: Ionic Conduction and Exafs Structural Investigation, Transport-structure Relations in Fast Ion and Mixed Conductors Proceedings of the 6th Riso International Symposium. Sep. 9-13, 1985, pp. 425-430.

Tregouet, Y.; Bernede, J.C., Silver Movements in Ag2Te Thin Films: Switching and Memory effects, Thin Solid Films 57 (1979) 49-54.

Uemura, O.; Kameda, Y.; Kokai, S.; Satow, T., Thermally Induced Crystallization of Amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric Field Induced Filament Formation in As-Te-Ge Glass, J. Non-Cryst. Solids 2 (1970) 358-370.

Viger, C.; Lefrancois, G.; Fleury, G., Anomalous Behaviour of Amorphous Selenium Films, J. Non-Cryst. Solids 33 (1996) 267-272.

Vodenicharov, C.; Parvanov,S.; Petkov,P., Electrode-limited Currents in the Thin-film M-GeSe-M System, Mat. Chem. and Phys. 21 (1989) 447-454.

Wang, S.-J.; Misium, G.R.; Camp, J.C.; Chen, K.-L.; Tigelaar, H.L., High-performance Metal/silicide Antifuse, IEEE Electron Dev. Lett. 13 (1992) 471-472.

Weirauch, D.F., Threshold Switching and Thermal Filaments in Amorphous Semiconductors, App. Phys. Lett. 16 (1970) 72-73.

West, W.C.; Sieradzki, K.; Kardynal, B.; Kozicki, M.N., Equivalent Circuit Modeling of the Ag|As0.24S0.36Ag0.40|Ag System Prepared by Photodissolution of Ag, J. Electrochem. Soc. 145 (1998) 2971-2974.

West, W.C., Electrically Erasable Non-volatile Memory Via Electrochemical Deposition of Multifractal Aggregates, Ph.D. Dissertation, ASU 1998, 189 pages.

Zhang, M.; Mancini, S.; Bresser, W.; Boolchand, P., Variation of Glass Transition Temperature, Tg, with Average Coordination Number, <m>, in Network Glasses: Evidence of a Threshold Behavior in the Slope |dTg/d<m>| at the Rigidity Percolation Threshold (<m>=2.4), J. Non-Cryst. Solids 151 (1992) 149-154.

\* cited by examiner

MEMORY ARRAY FOR INCREASED BIT DENSITY AND METHOD OF FORMING THE SAME

CROSS-REFERENCE TO RELATED APPLICATIONS

The present application is a divisional of U.S. application Ser. No. 11/585,795, filed Oct. 25, 2006 now U.S. Pat. No. 7,700,422, which is a divisional of U.S. application Ser. No. 11/111,836, filed Apr. 22, 2005, now U.S. Pat. No. 7,427,770, issued Sep. 23, 2008, the disclosures of which are incorporated herein by reference in their entirety.

FIELD OF THE INVENTION

The invention relates to the field of random access memory (RAM) devices formed using a resistance variable material.

BACKGROUND OF THE INVENTION

Resistance variable memory elements, which include Programmable Conductive Random Access Memory (PCRAM) elements using chalcogenides, have been investigated for suitability as semi-volatile and non-volatile random access memory devices. A typical chalcogenide resistance variable memory element is disclosed in U.S. Pat. No. 6,348,365 to Moore and Gilton.

In a typical chalcogenide resistance variable memory element, a conductive material, for example, silver, tin and copper, is incorporated into a chalcogenide glass. The resistance of the chalcogenide glass can be programmed to stable higher resistance and lower resistance states. An unprogrammed chalcogenide variable resistance element is normally in a higher resistance state. A write operation programs the element to a lower resistance state by applying a voltage potential across the chalcogenide glass and forming a conductive pathway. The element may then be read by applying a voltage pulse of a lesser magnitude than required to program it; the resistance across the memory device is then sensed as higher or lower to define two logic states.

The programmed lower resistance state of a chalcogenide variable resistance element can remain intact for an indefinite period, typically ranging from hours to weeks, after the voltage potentials are removed; however, some refreshing may be useful. The element can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such an element can function as a semi- or non-volatile variable resistance memory having at least two resistance states, which can define two respective logic states, i.e., at least a bit of data.

One exemplary chalcogenide resistance variable device uses a germanium selenide (i.e., $Ge_xSe_{100-x}$) chalcogenide glass as a backbone. The germanium selenide glass has, in the prior art, incorporated silver (Ag) and silver selenide ($Ag_{2+/-x}Se$) layers in the memory element. FIG. 1 depicts an example of a conventional chalcogenide variable resistance element 1. A semiconductive substrate 10, such as a silicon wafer, supports the memory element 1. Over the substrate 10 is an insulating material 11, such as silicon dioxide. A conductive material 12, such as tungsten, is formed over insulating material 11. Conductive material 12 functions as a first electrode for the element 1. An insulating material, 13 such as silicon nitride, is formed over conductive material 12. A glass material 51, such as $Ge_3Se_7$, is formed within via 22.

A metal material 41, such as silver, is formed over glass material 51. An irradiation process and/or thermal process are used to cause diffusion of metal ions into the glass material 51. A second conductive electrode 61 is formed over dielectric material 13 and metal material 41.

The element 1 is programmed by applying a sufficient voltage across the electrodes 12, 61 to cause the formation of a conductive path between the two electrodes 12, 61, by virtue of a conductor (i.e., such as silver) that is present in metal ion laced glass layer 51. In the illustrated example, with the programming voltage applied across the electrodes 12, 61, the conductive pathway forms from electrode 12 towards electrode 61.

A plurality of resistance variable memory elements can be included in a memory array. In doing so, it is desirable to provide a high density of memory elements.

BRIEF SUMMARY OF THE INVENTION

Exemplary embodiments of the invention provide a memory array having a plurality of resistance variable memory units and methods for forming the same. Each memory unit includes a first electrode, a resistance variable material over the first electrode, and a first second-electrode over the resistance variable material. The first second-electrode is associated with the first electrode to define a first memory element. Each memory unit further includes a second second-electrode over the resistance variable material. The second-second electrode is associated with the first electrode to define a second memory element.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The term "resistance variable material" is intended to include materials that can change resistance in response to an applied voltage. Such materials include, as non-limiting examples, chalcogenide glasses, chalcogenide glasses comprising a metal, such as silver, tin, copper, among others; a polymer, such as polymethylphenylacetylene, copperphtalocyanine, polyparaphenylene, polyphenylenevinylene, polyaniline, polythiophene and polypyrrole; and amorphous carbon.

Figure 1:
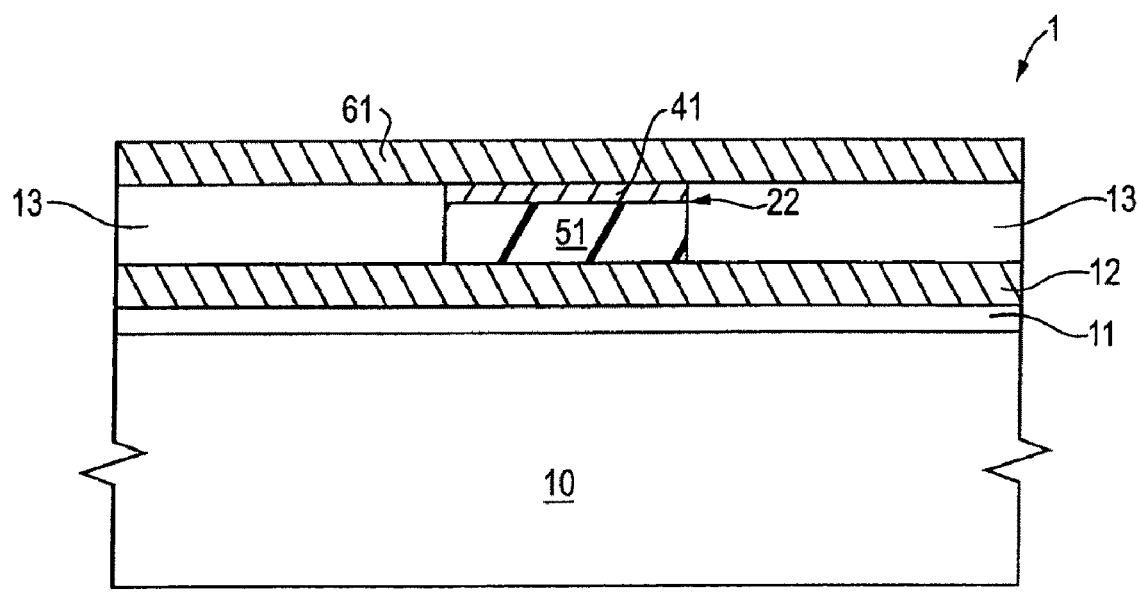
FIG. 1 illustrates a cross sectional view of a conventional resistance variable memory element.
Figure 2A:
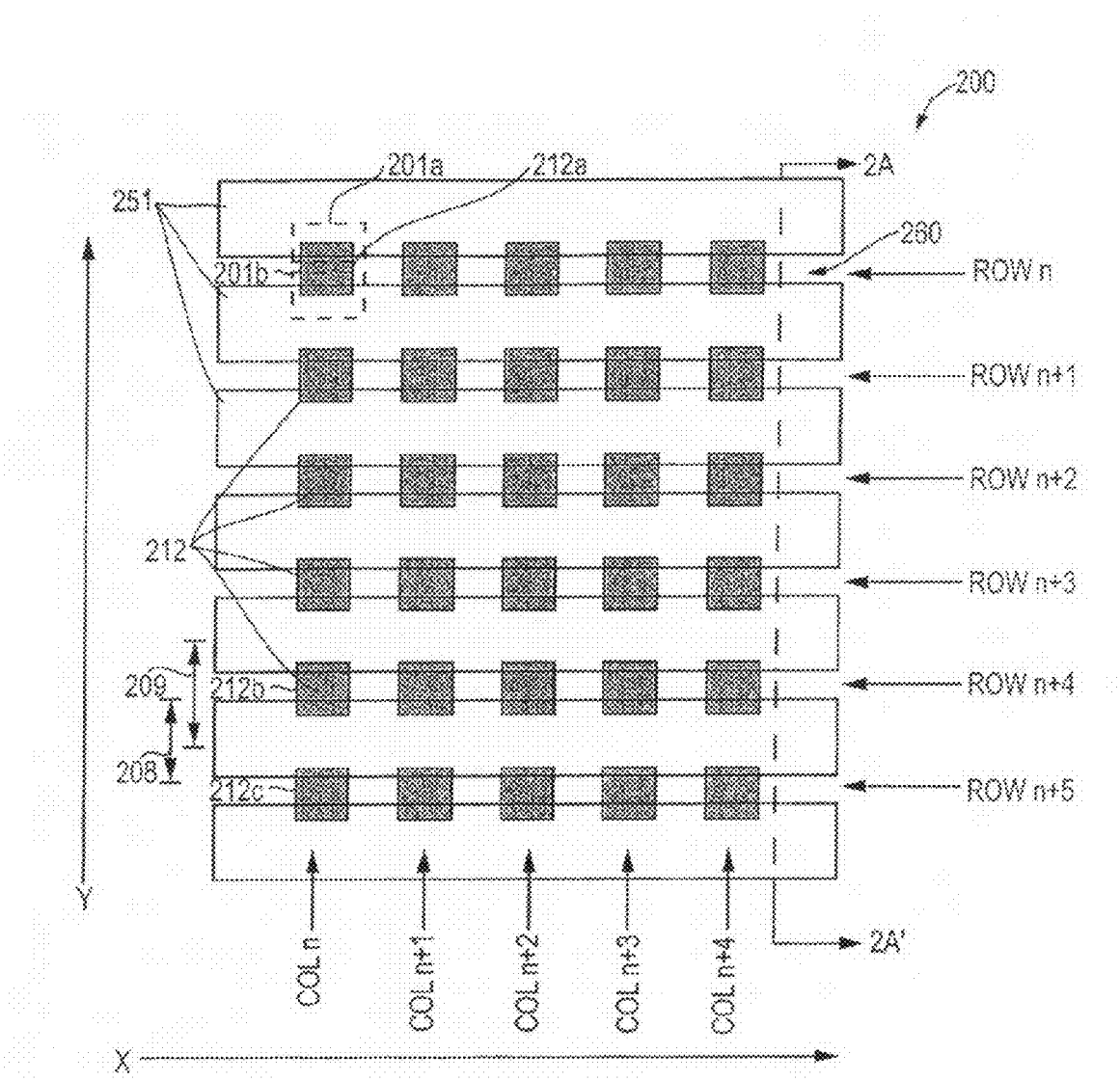
FIG. 2A depicts a portion of a memory array including memory elements according to an exemplary embodiment of the invention.
Figure 2B:
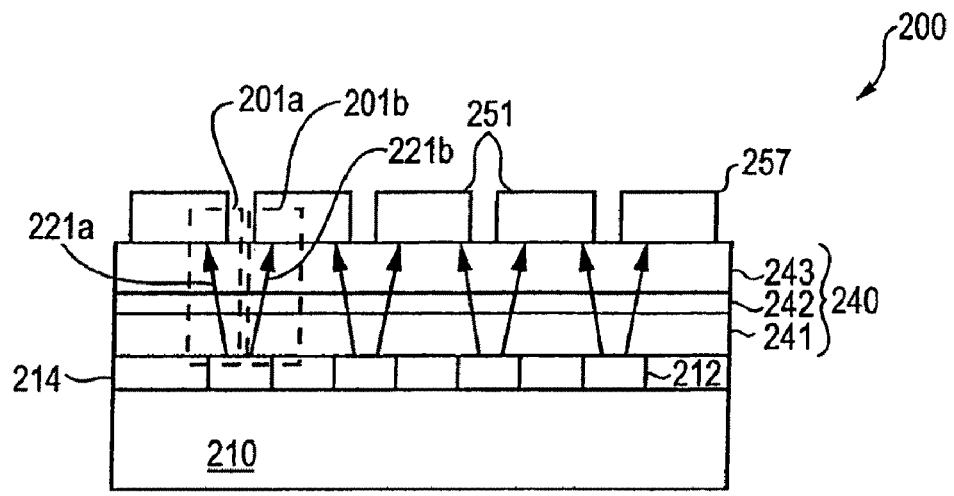
FIG. 2B illustrates a cross sectional view of a portion of the memory array shown in FIG. 2A taken along line 2A-2A' and according to an exemplary embodiment of the invention.
Figure 2C:
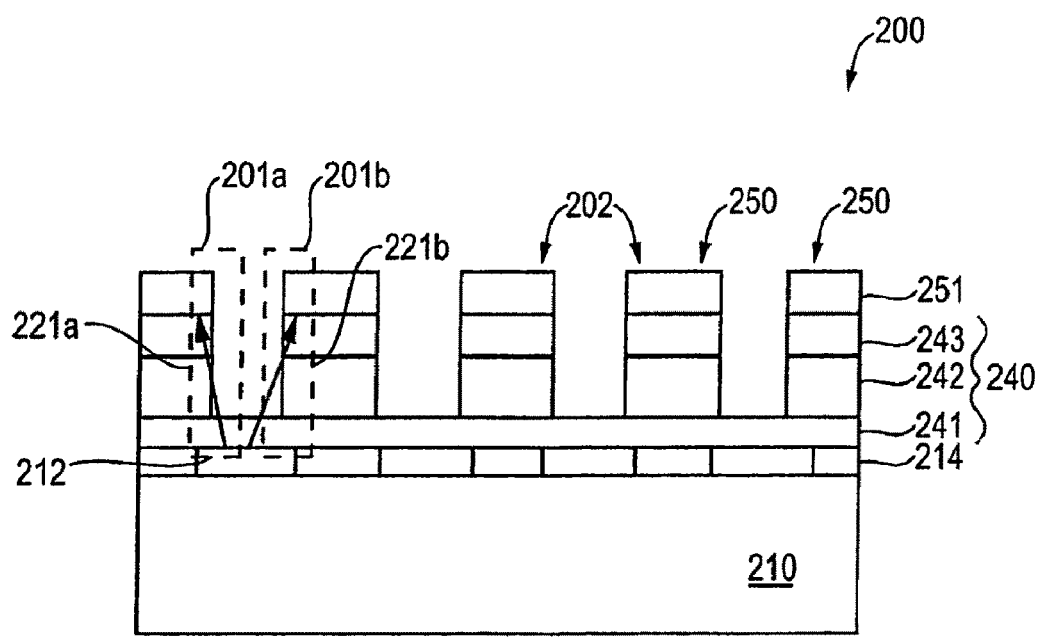
FIG. 2C illustrates a cross sectional view of a portion of the memory array shown in FIG. 2A taken along line 2A-2A' and according to another exemplary embodiment of the invention.

The invention is now explained with reference to the figures, which illustrate exemplary embodiments and throughout which like reference numbers indicate like features. FIGS. 2A-2C depict a portion of a memory array 200 according to exemplary embodiments of the invention. FIGS. 2B and 2C are cross-sections illustrating a portion of the memory array 200 of FIG. 2A taken along line 2A-2A' and according to alternate embodiments of the invention.

Referring to FIGS. 2A and 2B, the array 200 is supported by a substrate 210. Over the substrate 210, though not necessarily directly so, is a first (e.g., a bottom) electrode 212 for each memory element 101a, 101b. This electrode 212 is preferably tungsten (W), but may be any conductive material, such as aluminum, among others. An insulating layer 214 is between the first electrodes 212 and can be, for example, silicon nitride ($Si_3N_4$), a low dielectric constant material, an insulating glass, or an insulating polymer, but is not limited to such materials.

A stack 240 of layers is formed over the first electrodes 212. The stack 240 includes one or more layers of resistance variable material. The stack 240 can include one or more layers of other materials such as, for example, metal.

In the exemplary embodiments shown in FIGS. 2A-2C, the memory cell stack 240 includes, for example, a chalcogenide material layer 241, a tin-chalcogenide layer 242, and an optional metal layer 243. The invention, however, is not limited to such embodiments, and the stack 240 can include additional or fewer layers of other materials suitable for forming a resistance variable memory element. For example, the stack 240 can include a second chalcogenide material layer (not shown) over the metal layer 243. The second chalcogenide layer may be a same material as the chalcogenide layer 241 or a different material.

In the illustrated embodiments, the chalcogenide material layer 241 is e.g., germanium selenide ($Ge_xSe_{100-x}$). The germanium selenide may be within a stoichiometric range of about $Ge_{33}Se_{67}$ to about $Ge_{60}Se_{40}$. The chalcogenide material layer 241 may be between about 100 Å and about 1000 Å thick, e.g., about 300 Å thick. Layer 241 need not be a single layer, but may also be comprised of multiple chalcogenide sub-layers having the same or different stoichiometries. The chalcogenide material layer 241 is in electrical contact with the underlying electrodes 212.

Over the chalcogenide material layer 241 is an optional layer of metal-chalcogenide 242 such as tin-chalcogenide (e.g., tin selenide ($Sn_{1+/-x}Se$, where x is between about 1 and about 0)), or silver-chalcogenide (e.g., silver selenide). It is also possible that other chalcogenide materials may be substituted for selenium, such as sulfur, oxygen, or tellurium. The layer 242 in the exemplary embodiment is a layer of tin-chalcogenide layer and may be about 100 Å to about 400 Å thick; however, its thickness depends, in part, on the thickness of the underlying chalcogenide material layer 241. The ratio of the thickness of the tin-chalcogenide layer 242 to that of the underlying chalcogenide material layer 241 should be between about 5:1 and about 1:3.

An optional metal layer 243 is provided over the tin-chalcogenide layer 242, with silver (Ag) being the exemplary metal. This metal layer 243 is between about 300 Å and about 500 Å thick. Over the metal layer 243 are second (e.g., top) electrodes 251. The second electrodes 251 can be made of the same material as the first electrodes 212, but are not required to be so formed. In the exemplary embodiment shown in FIGS. 2A and 2B, the second electrodes 251 are preferably tungsten (W).

Although in the illustrated exemplary embodiments of the invention, stack 240 is shown including layers 241, 242, 243, it should be appreciated that one or more of layers 241, 242, 243 may be excluded and other layers may be included. Non limiting examples of materials and layers that can be included in stack 240 and materials for electrodes 212, 251 are discussed in various patents and patent applications assigned to Micron Technology, Inc., including, but not limited to the following: U.S. patent application Ser. Nos. 10/765,393; 09/853,233; 10/022,722; 10/663,741; 09/988,984; 10/121, 790; 09/941,544; 10/193,529; 10/100,450; 10/231,779; 10/893,299; 10/077,872; 10/865,903; 10/230,327; 09/943, 190; 10/622,482; 10/081,594; 10/819,315; 11/062,436; 10/899,010; and 10/796,000, which are incorporated herein by reference.

In the embodiment of FIG. 2B, all layers 241, 242, 243 of the stack 240 are blanket layers extending over the array 200. In an alternative embodiment shown in FIG. 2C, at least a portion of the stack 240 is patterned. When one or more top layers of the stack 240 are conductive, it is desirable to pattern those layers similarly to the second electrodes 251 to avoid the second electrodes 251 being shorted together. Specifically, in the embodiment illustrated in FIG. 2C, chalcogenide material layer 241 is a blanket layer over the memory array and is shared by all memory elements 201a, 201b of the array 200, and optional metal-chalcogenide layer 242 and optional metal layer 243 are patterned. Layers 242, 243 are patterned similarly to the second electrodes 251, as shown in FIG. 2C. Layers 242, 243 and second electrodes 251 are patterned to form longitudinally extending element stacks 202. While FIG. 2C shows only layers 242, 243, 251 as being patterned, it should be appreciated that layer 241 could also be patterned.

As shown in FIG. 2A, the second electrodes 251 are formed as lines along the x (first) direction of a memory array. The first electrodes 212 have a pitch 208, which, for example, is the distance in the y direction from about the center of a first electrode 212b in row n+4 to about the center of a first electrode 212c in row n+5. The second electrodes 251 have a pitch 209, which is approximately the same as the pitch 208 of the first electrodes 212. The second electrodes 251 are offset by approximately one half pitch 208 (or 209) from the first electrodes 212. Accordingly, as shown in FIGS. 2A-2C, each first electrode 212 underlies a region 260 between two second electrodes 251. In the exemplary embodiment of FIGS. 2A-2C, each first electrode 212 underlies a portion of two adjacent second electrodes 251. For example, each first electrode 212 of word row n underlies a portion of the two adjacent second electrodes 251 (one shown above row n in the y (second) direction and a second one below row n in the y direction).

The array 200 includes memory elements 201a, 201b, each for storing at least one bit, i.e., a logic 1 or 0. Since each first electrode 212 underlies two second electrodes 251, each first electrode 212 is associated with two memory elements 201a, 201b. Accordingly, the bit density of the array 200 can be increased over prior art arrays that have a single first electrode associated with a single second electrode and thus, a single memory element. During operation, conductive pathways 221a, 221b are formed, which causes a detectible resistance change across the memory elements 201a, 201b, respectively.

Figure 3A:
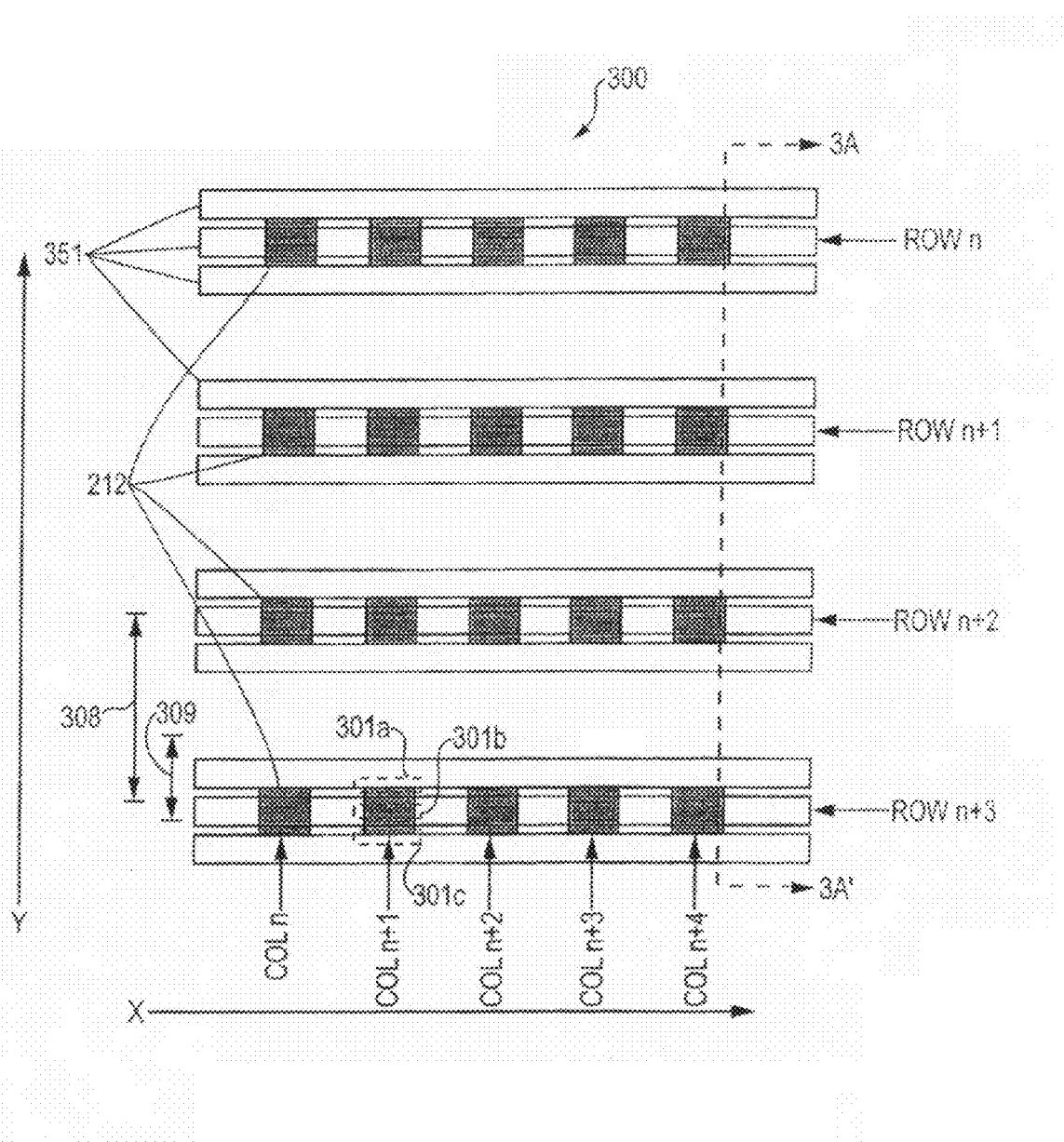
FIG. 3A depicts a portion of a memory array including memory elements according to another exemplary embodiment of the invention.
Figure 3B:
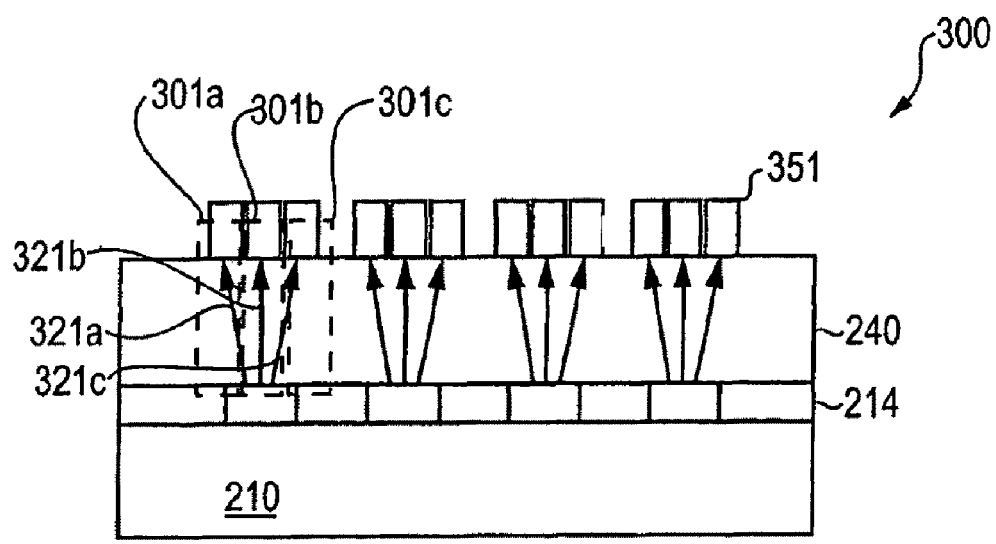
FIG. 3B illustrates a cross sectional view of a portion of the memory array shown in FIG. 3A taken along line 3A-3A' and according to an exemplary embodiment of the invention.
Figure 3C:
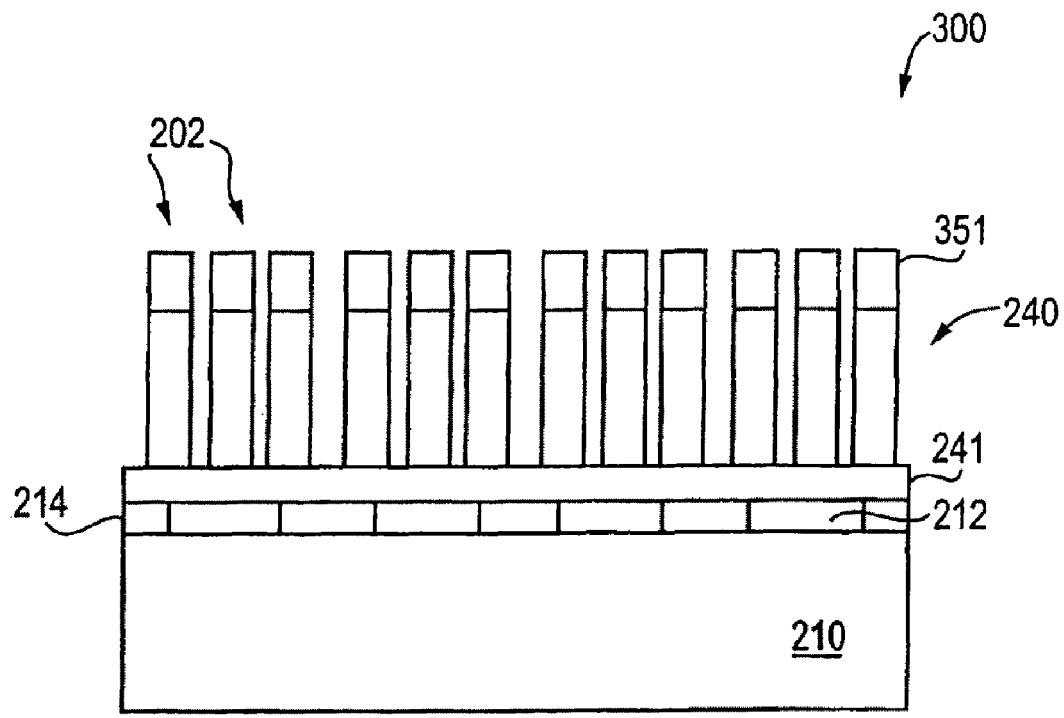
FIG. 3C illustrates a cross sectional view of a portion of the memory array shown in FIG. 3A taken along line 3A-3A' and according to another exemplary embodiment of the invention.

FIGS. 3A-3C depict a portion of a memory array 300 according to additional exemplary embodiments of the invention. Specifically, FIG. 3A shows a portion of a memory array 300. FIGS. 3B and 3C show a cross-section of the memory array 300 of FIG. 3A taken along the line 3A-3A'. The embodiments of FIGS. 3A-3C are similar to those depicted in FIGS. 2A-2C, except that each first electrode 212 is associated with three second electrodes 351.

As shown in FIG. 3A, the second electrodes 351 are lines along the x direction. The first electrodes 212 have a pitch 308 in the y direction. The second electrodes lines 351 are arranged on a smaller pitch 309 than the first electrodes 212, such that three or more second electrodes 351 are associated with each first electrode 212. In the illustrated embodiment, three second electrodes 351 can address each first electrode 212, but the array 300 could be configured such that electrodes 351 have an even smaller pitch as compared to the pitch 308 of the first electrodes, such that more than three second electrodes 351 can address a single first electrode 212.

The illustrated array 300 includes memory elements 301a, 301b, 301c, each for storing at least one bit, i.e., a logic 1 or 0. Since each first electrode 212 is addressable by three second electrodes 351, each first electrode 212 is associated with three memory elements 301a, 301b, 301c. Accordingly the bit density of the array 300 can be increased over the embodiment shown in FIGS. 2A-2C.

In the embodiment shown in FIG. 3B all layers 241, 242, 243 of the stack 240 are blanket layers and are continuously shared by all memory elements 301a, 301b, 301c of the array 300. In an alternative embodiment shown in FIG. 3C, at least a portion of the stack 240 is patterned by etching. Specifically, in the embodiment illustrated in FIG. 3C, chalcogenide material layer 241 is a blanket layer and is shared by all memory elements 301a, 301b, 301c of the array 300, and tin-chalcogenide layer 242 and metal layer 243 are patterned. The layers 242, 243 are patterned similarly to the second electrodes 351. While FIG. 3C shows only layers 242, 243 as being patterned, it should be appreciated that layer 241 could also be patterned.

Figure 4A:
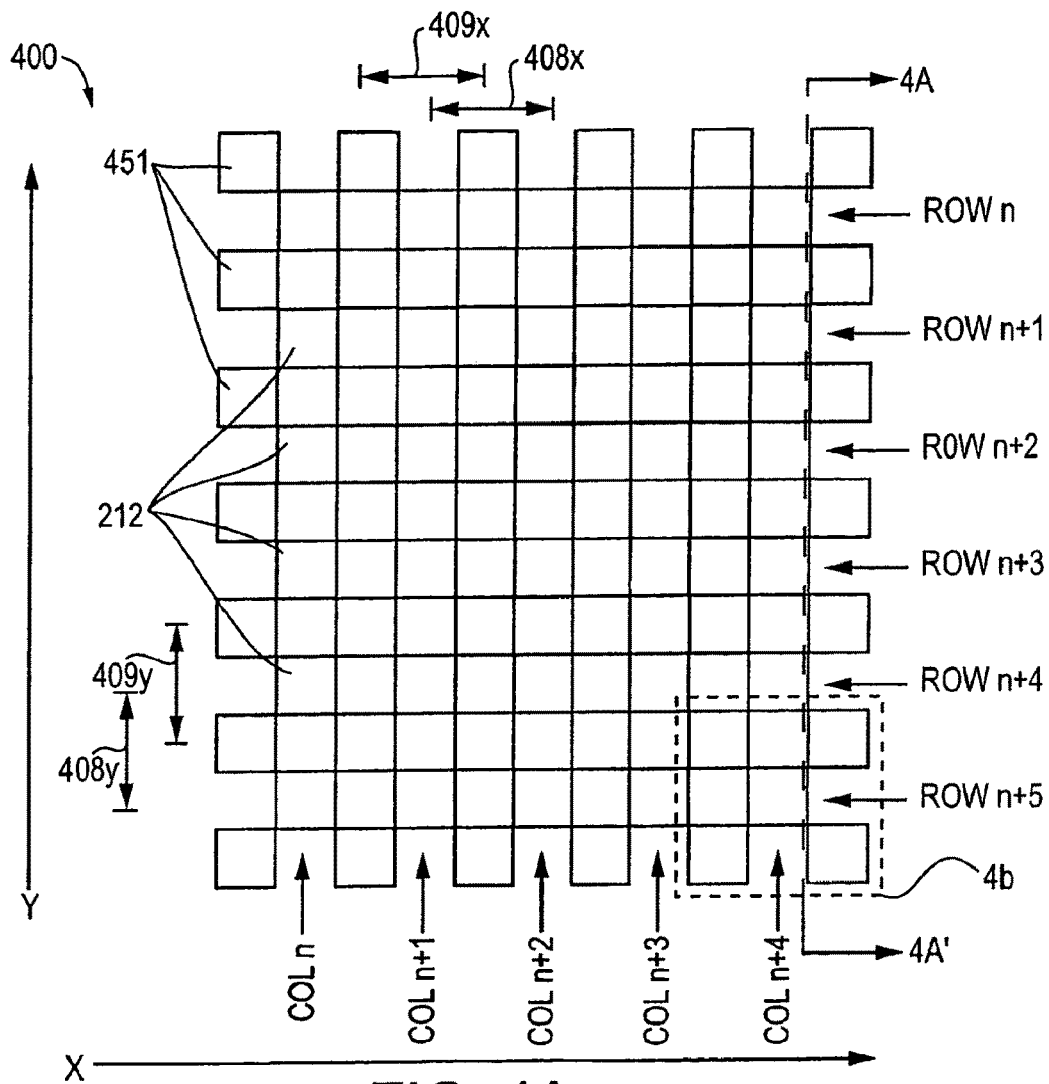
FIG. 4A depicts a portion of a memory array including memory elements according to another exemplary embodiment of the invention.
Figure 4B:
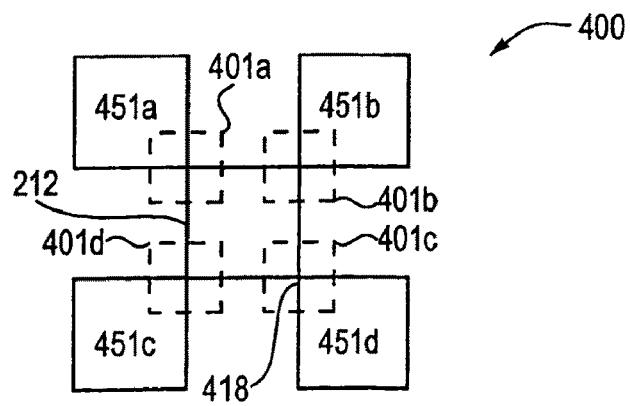
FIG. 4B illustrates an enlarged portion of the array of FIG. 4A.

FIGS. 4A-4B depict a portion of a memory array 400 according to another exemplary embodiment of the invention. Specifically, FIG. 4A shows a portion of a memory array 400 and FIG. 4B is an enlarged view of the portion of FIG. 4A. The embodiment shown in FIGS. 4A-4B is similar to those depicted in FIGS. 2A-3C, except that each first electrode 212 is associated with four second electrodes 451.

As shown in FIG. 4A, the first electrodes 212 have a pitch 408x in the x direction and 408y in the y direction. The second electrodes 451 are arranged to have approximately the same pitches 408x, 408y, but are offset from the first electrodes 212 by about one half pitch. Accordingly, the second electrodes 451 have a pitch 409x, 409y. Also, it is preferable that the second electrodes 451 directly overlie at least a portion of the first electrode 212 that they address. Specifically, as shown in FIG. 4B, corners 418 of second electrodes 451a, 451b, 451c, 451d directly overlie corners of a corresponding first electrode 212.

The array 400 includes memory elements 401a, 401b, 401c, 401d each for storing at least one bit, i.e., a logic 1 or 0. Since each first electrode 212 is addressable by four second electrodes 451, each first electrode 212 is associated with four memory elements 401a, 401b, 401c, 401d. Accordingly the bit density of the array 400 can be increased over the embodiment shown in FIGS. 2A-3C.

A cross-sectional view of the array 400 along line 4A-4A' would appear similar to the cross-sectional views shown in FIGS. 2B and 2C. Second electrodes 451 would appear in a same position as the electrodes 251 shown in FIGS. 2B and 2C. For simplicity, cross-sectional views of the array 400 are omitted and reference is made to FIGS. 2B and 2C. The array 400 includes stack 240 having layers 241, 242, 241, as represented in FIGS. 2B and 2C. Additionally, the layers 241, 242, 243 can be blanket layers (as represented in FIG. 2B) or a portion of the stack 240, e.g., layer 242, 243, can be patterned (as represented in FIG. 2C).

Figure 5B:
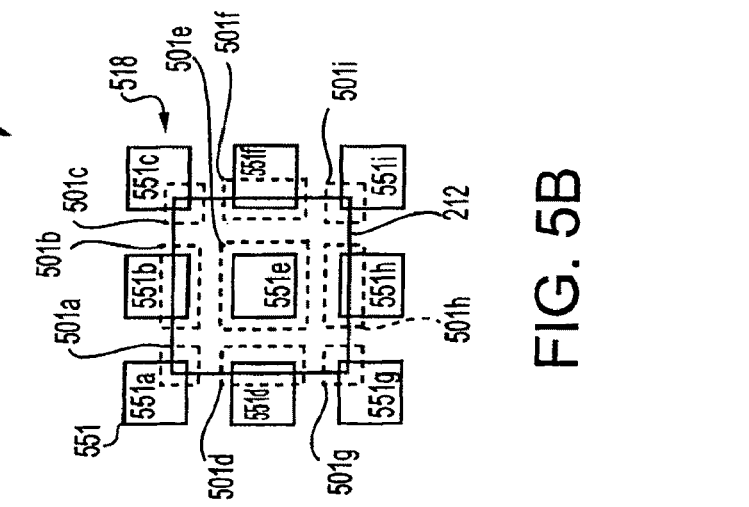
FIG. 5B illustrates an enlarged portion of the array of FIG. 5A.
Figure 5A:
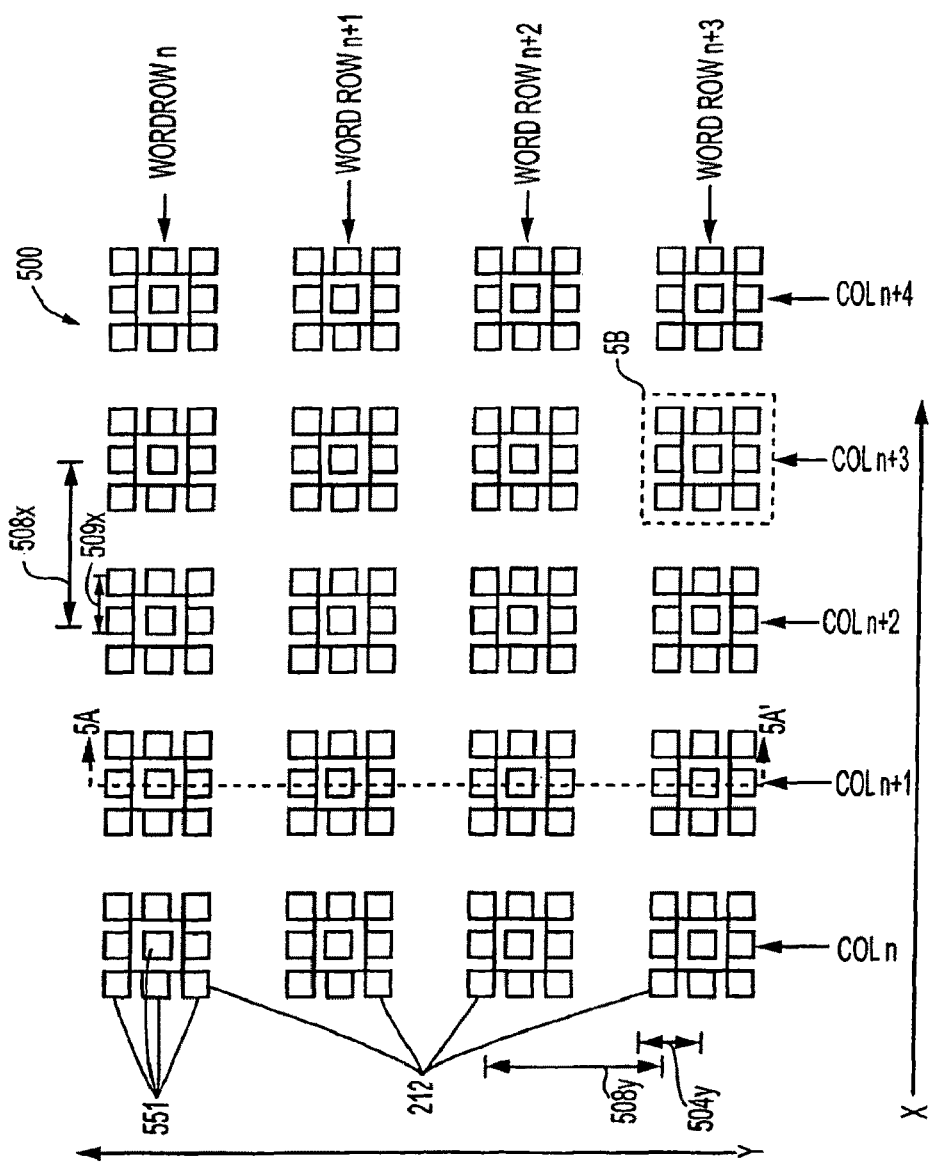
FIG. 5A depicts a portion of a memory array including memory elements according to another exemplary embodiment of the invention.

FIGS. 5A-5B depict a portion of a memory array 500 according to additional exemplary embodiments of the invention. Specifically, FIG. 5A shows a portion of a memory array 500 and FIG. 5B is an enlarged view of the portion of FIG. 5A. The embodiments shown in FIGS. 5A-5B are similar to those depicted in FIGS. 2A-4D, except that each first electrode 212 is associated with nine second electrodes 551.

As shown in FIG. 5A, the first electrodes 212 have a pitch 508x in the x direction and 508y in the y direction. The second electrodes 551 are arranged on a smaller pitches 509x in the x direction and 509y in the y direction such that nine second electrodes 551 can address each first electrode 212. In the illustrated embodiment, nine second electrodes 551 can address each first electrode 212, but the array 500 could be configured such that electrodes 551 have different pitches as compared to the pitches 508x, 508y of the first electrodes 212, such that greater or fewer than nine second electrodes 551 can address a single first electrode 212.

Also, it is preferable that the second electrodes 451 directly overlie at least a portion of the first electrode 212 that they address. Specifically, as shown in FIG. 5B, corners and/or edges 518 of second electrodes 551a, 551b, 551c, 551f, 551i, 551h, 551g, 551d directly overlie corners of a corresponding first electrode 212. The whole of second electrode 551e directly overlies the first electrode 212.

The array 500 includes memory elements 501a, 501b, 501c, 501d, 501e, 501f, 501g, 501h, 501i each for storing one bit, i.e., a logic 1 or 0. Since each first electrode 212 is addressable by nine second electrodes 551, each first electrode 212 is associated with nine memory elements 501a, 501b, 501c, 501d, 501e, 501f, 501g, 501h, 501i. Accordingly the bit density of the array 500 is increased over the embodiment shown in FIGS. 2A-4B.

A cross-sectional view of the array 500 taken along line 5A-5A' would appear similar to the cross-sectional views shown in FIGS. 3B and 3C. Second electrodes 551 would appear in a same position as the electrodes 351 shown in FIGS. 3B and 3C. For simplicity, cross-sectional views of the array 500 are omitted and reference is made to FIGS. 3B and 3C. The array 500 includes stack 240 having layers 241, 242, 241, as represented in FIGS. 3B and 3C. Additionally, the layers 241, 242, 243 can be blanket layers (as represented in FIG. 3B) or a portion of the stack 240, e.g., layer 242, 243, can be patterned (as represented in FIG. 3C).

The formation the memory array 200 (FIGS. 2A-2C) according to one exemplary embodiment of the invention is now described. No particular order is required for any of the actions described herein, except for those logically requiring the results of prior actions. Accordingly, while the actions below are described as being performed in a general order, the order is exemplary only and can be altered if desired. Although the formation of only a portion of an array 200 is shown, it should be appreciated that the memory array 200 can include additional memory elements 201a, 201b, which can be formed concurrently.

Figure 6A:
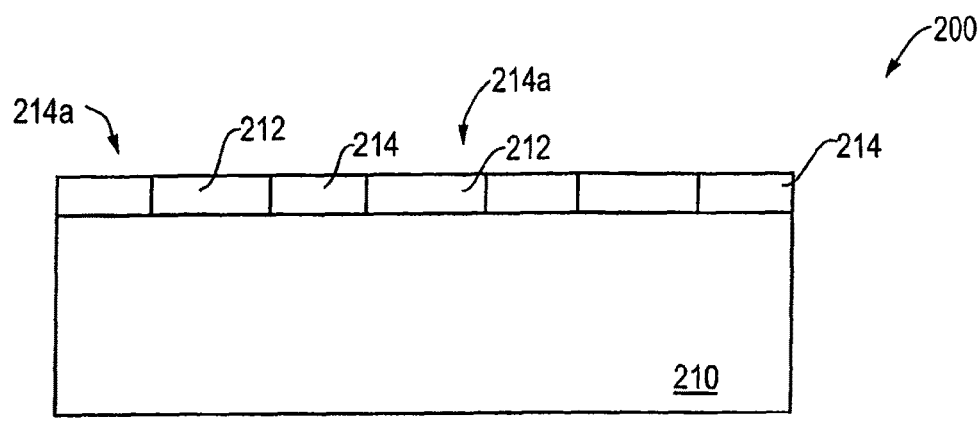
FIGS. 6A-6F depict the formation of the memory elements of FIG. 2A at different stages of processing.

As shown by FIG. 6A, a substrate 210 is initially provided. As indicated above, the substrate 210 can be semiconductor-based or another material useful as a supporting structure. An insulating layer 214 is formed over the substrate 210. The insulating layer 214 can be silicon nitride, a low dielectric constant material, or other insulators known in the art, and may be formed by any known method. Preferably, the insulating layer 214 (e.g., silicon nitride) does not allow metal ion migration from the optional metal-chalcogenide layer 242. An opening 214a in the insulating layer 214 is made, for instance by photolithographic and etching techniques, exposing a portion of the substrate 210. A first electrode 212 is formed within the opening 214a, by forming a layer of conductive material over the insulating layer 214 and in the opening 214a. A chemical mechanical polishing (CMP) step is performed to remove the conductive material from over the insulating layer 214. Desirably, the first electrode 212 is formed of tungsten, but may be any conductive material.

Figure 6B:
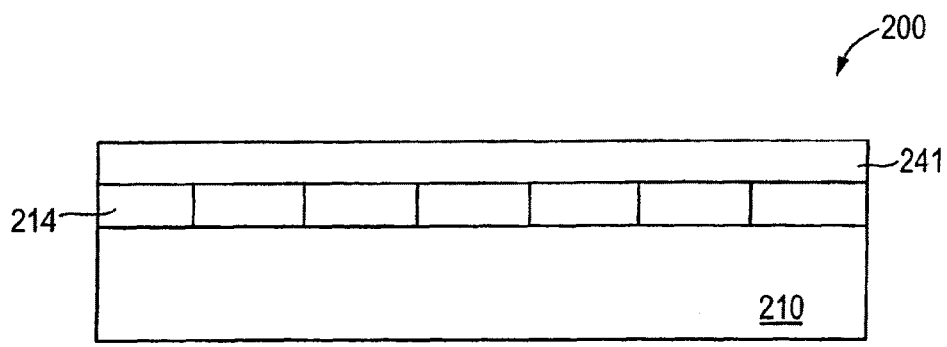

At least one layer of a memory stack 240 is formed over the insulating layer 214 and first electrodes 212, as depicted in FIG. 6B. In the illustrated embodiment, a chalcogenide material layer 241 is formed over the first electrodes 212 and insulating layer 214. Formation of the chalcogenide material layer 241 may be accomplished by any suitable method, for example, by sputtering.

Figure 6C:
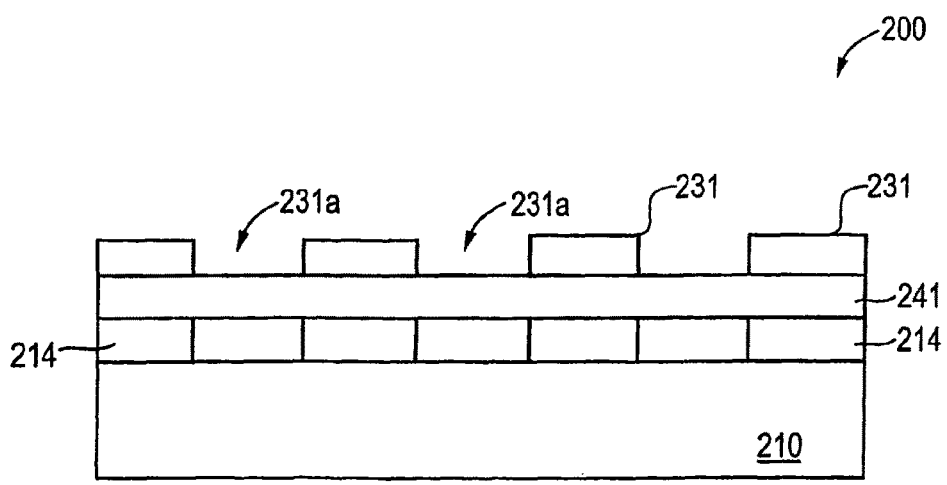

When it is desirable to etch one or more layers of the stack 240 (FIG. 2C), an etch stop layer 231 is formed over the chalcogenide material layer 241. As shown in FIG. 6C, the etch stop layer is patterned to provide openings 231a over the layer 241 offset from the first electrodes 212. The etch stop layer 231 is chosen to have a high selectivity to the etch chemistry used to etch certain layers of the memory cell stack 240. Accordingly, the particular etch stop layer may depend on the composition of the memory cell stack 240. In the illustrated embodiment, an exemplary etch stop layer is transparent carbon, although other materials can be used.

Figure 6D:
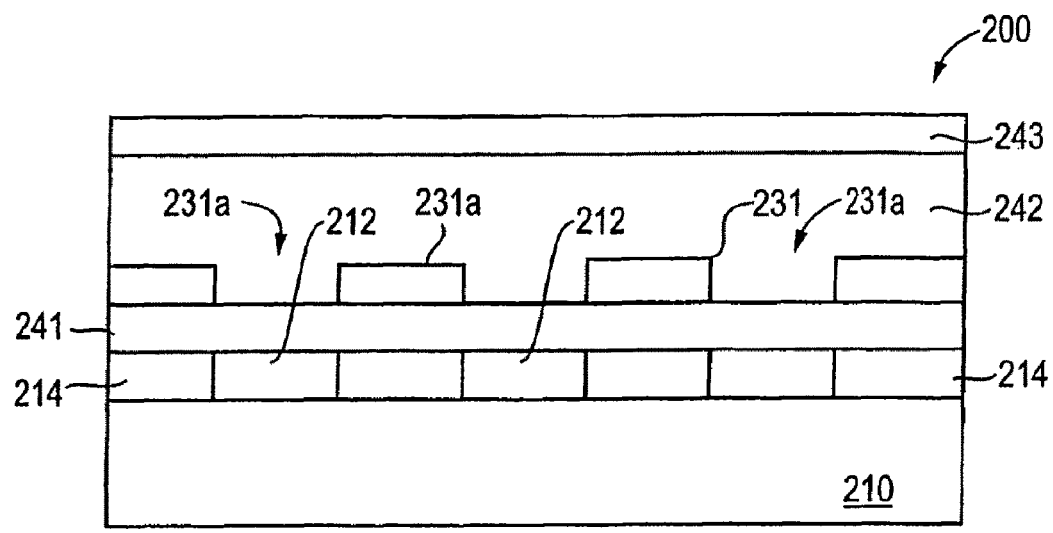

As shown in FIG. 6D, additional layers of the memory stack 240 are formed over the etch stop layer and in opening 231a. In the illustrated embodiment, an optional metal-chalcogenide layer 242 (e.g., tin-chalcogenide) is formed over the etch stop layer and in opening 231a and in contact with the chalcogenide material layer 241. The metal-chalcogenide layer 242 can be formed by any suitable method, e.g., physical vapor deposition, chemical vapor deposition, co-evaporation, sputtering, among other techniques. An optional metal layer 243 is formed over the tin-chalcogenide layer 242. The metal layer 243 is preferably silver (Ag), or at contains silver, and is formed to a preferred thickness of about 300 Å to about 500 Å. The metal layer 243 may be deposited by any technique known in the art.

When the structure of FIG. 2B is desired, formation of the etch stop layer 231 is omitted and the layer 242, 243 are formed on the layer 241.

Figure 6E:
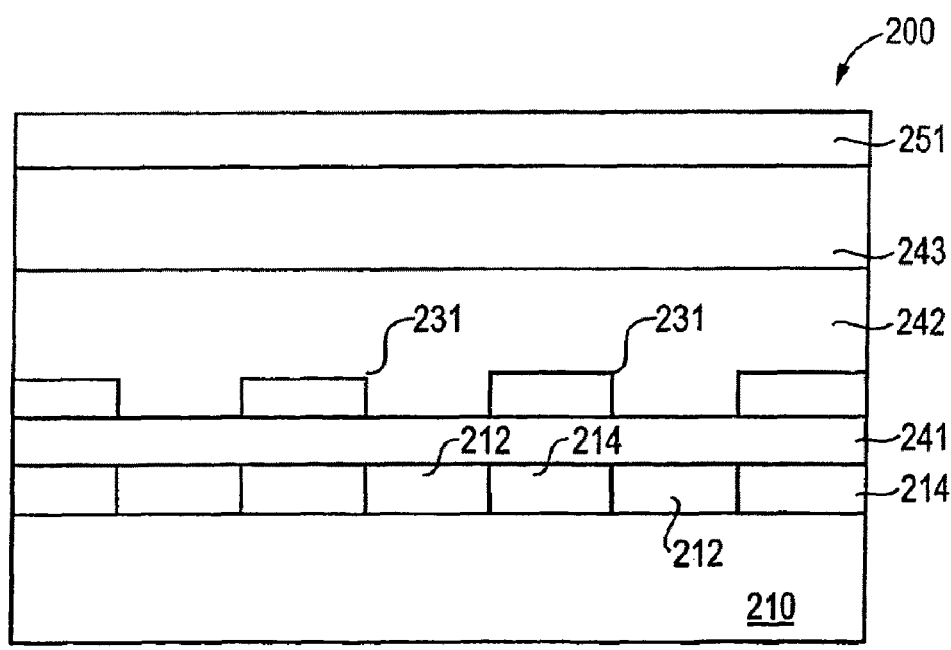

Referring to FIG. 6E, a conductive material is deposited over the metal layer 243 to form a second electrode 251. Similar to the first electrode 212, the conductive material for the second electrode 251 may be any material suitable for a conductive electrode. In one exemplary embodiment the second electrode 251 is tungsten.

Figure 6F:
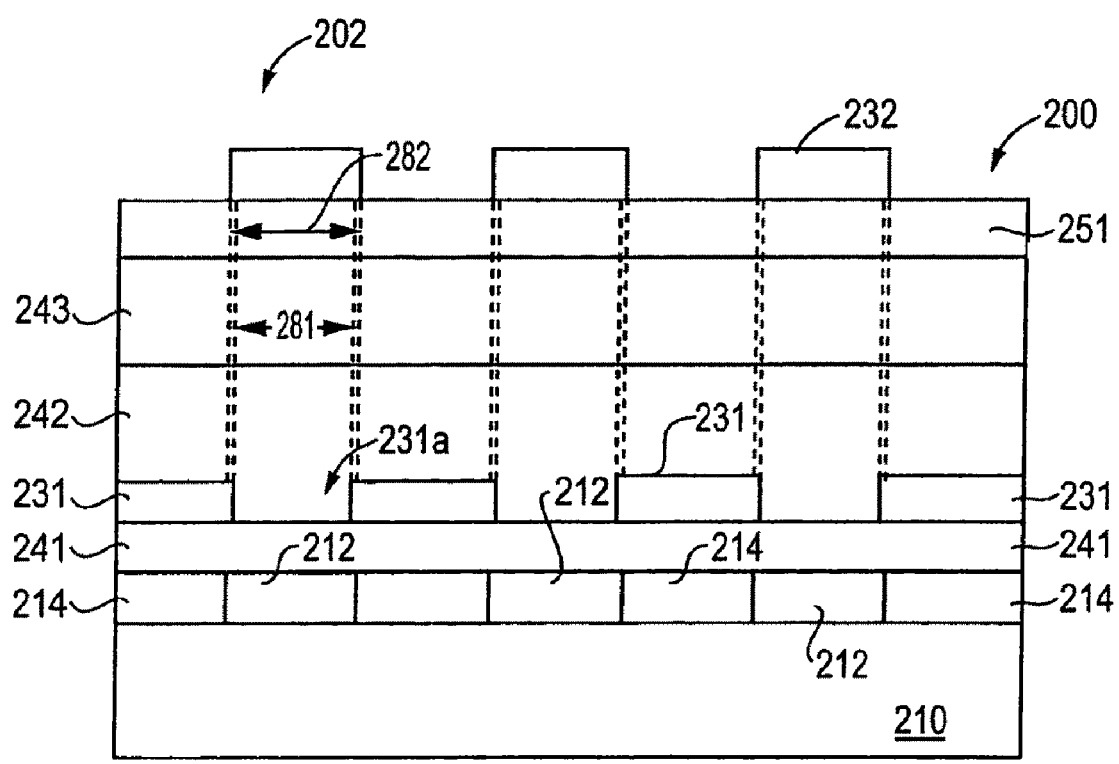

As illustrated in FIG. 6F, a photoresist layer 232 (or other mask layer) is deposited over the second electrode 251 layer to define second electrodes 251. When the structure of FIG. 2B is desired, only the second electrode layer 251 is etched. When the structure of FIG. 2B is desired, second electrode layer 251 and layers 242, 243 are etched to define stacks 202. The etching stops at the etch stop layer 231. Desirably, the mask layer 232 is formed to define stacks 202 such that the stacks 202 have a width 282, which is larger than the width 281 of the opening 231a. This provides for an alignment margin between the mask layers used to define openings 231a and the photoresist layer 232.

The photoresist layer 232 is removed, leaving one of the structures shown in FIG. 2B or 2C.

Additional steps may be performed to complete the memory array 200. For example, an insulating layer (not shown) may be formed over the second electrodes 251. Also, other processing steps can be conducted to electrically couple the array 200 to, peripheral circuitry (not shown) and to include the array 200 in an integrated circuit or processor system, e.g., processor system 700 described below in connection with FIG. 7.

The method described above can be used to form any memory array 300 (FIGS. 3A-3C), 400 (FIGS. 4A-4B), 500 (FIGS. 5A-5B) according to the invention. When forming any of the arrays 300, 400, and 500, the second electrodes 351, 451, 551 (and optionally layers 242, 243), respectively, are patterned to achieve the respective structures described in FIGS. 3A-5B.

Figure 7:
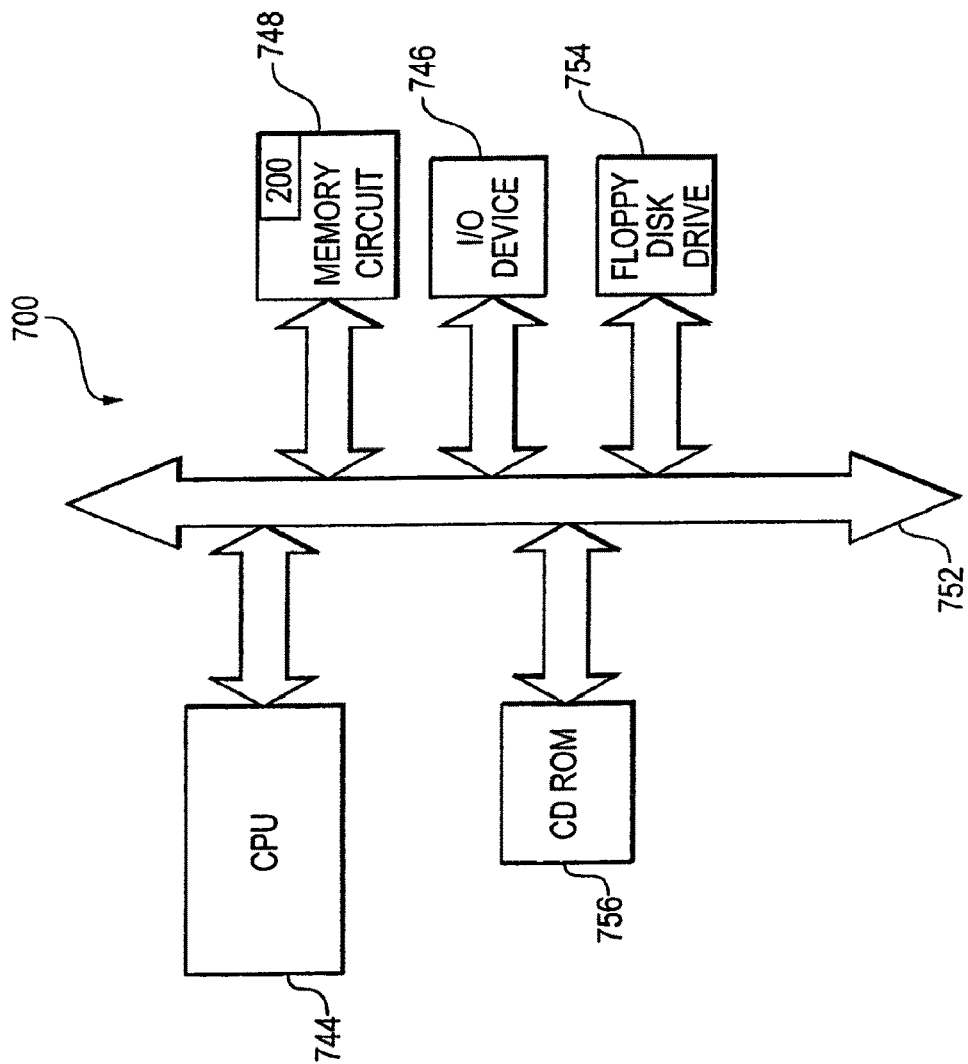
FIG. 7 is a block diagram of a system including a memory element according to an exemplary embodiment of the invention.

FIG. 7 illustrates a processor system 700 which includes a memory circuit 748, e.g., a memory device, which employs memory array 200 constructed according to the invention. The circuit 748 could instead employ any of memory arrays 300 (FIGS. 3A-3C), 400 (FIGS. 4A-4B), or 500 (FIGS. 5A-5B). The processor system 700, which can be, for example, a computer system, generally comprises a central processing unit (CPU) 744, such as a microprocessor, a digital signal processor, or other programmable digital logic devices, which communicates with an input/output (I/O)

device 746 over a bus 752. The memory circuit 448 communicates with the CPU 744 over bus 752 typically through a memory controller.

In the case of a computer system, the processor system 700 may include peripheral devices such as a floppy disk drive 754 and a compact disc (CD) ROM drive 756, which also communicate with CPU 744 over the bus 752. Memory circuit 748 is preferably constructed as an integrated circuit, which includes a memory array 200 according to the invention. If desired, the memory circuit 748 may be combined with the processor, for example CPU 744, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory array comprising:
   at least one first memory unit comprising:
   a first first-electrode located in a first column;
   a resistance variable material over the first first-electrode;
   a first second-electrode over the resistance variable material and located in a first row;
   a second second-electrode over the resistance variable material and located in a second row, wherein the first first-electrode is capable of forming a first conductive pathway with the first second-electrode and a second conductive pathway with the second second-electrode; and;
   at least one second memory unit comprising a second first-electrode located in the first column, wherein the resistance variable material is over the second first-electrode, and wherein the second first-electrode is capable of forming a third conductive pathway with the second second-electrode.

2. The memory array of claim 1, wherein the second-electrodes are lines.

3. The memory array of claim 1, wherein the first-electrodes have a pitch, and wherein the second-electrodes are offset from the first-electrodes by about one half the pitch of the first-electrodes.

4. The memory array of claim 1, further comprising a third second-electrode over the resistance variable material, wherein the first first-electrode is capable of forming a third conductive pathway with the third second-electrode.

5. The memory array of claim 4, further comprising a fourth second-electrode over the resistance variable material, wherein the first electrode is capable of forming a fourth conductive pathway with the fourth second-electrode.

6. The memory array of claim 5, wherein the first-electrodes have a first pitch in a first direction and a second pitch in a second direction, and wherein the second-electrodes are offset from the first-electrodes by about one half pitch in each of the first and second directions.

7. The memory array of claim 1, wherein the resistance variable material comprises a chalcogenide material.

8. The memory array of claim 7, further comprising a metal-chalcogenide layer over the chalcogenide material.

9. The memory array of claim 8, further comprising a metal layer over the chalcogenide material.

10. The memory array of claim 9, wherein the metal-chalcogenide layer and the metal layer are configured in a same pattern as the second electrodes.

11. A memory array comprising:
    a plurality of first electrodes arranged in plurality of columns and a plurality of rows and having a first pitch along a row direction,
    a resistance variable material over the first electrodes;
    a plurality of second electrode lines having a second pitch along the row direction, each first electrode of each column being associated with a plurality of second electrode lines to define a plurality of memory elements, wherein each first electrode is addressable by each of the associated plurality of second electrode lines.

12. The memory array of claim 11, wherein the first pitch is greater than the second pitch.

13. The memory array of claim 11, wherein two second electrode lines are associated with each first electrode.

14. The memory array of claim 11, wherein the first electrodes are arranged in a plurality of rows, and wherein each second electrode line is associated with at least one first electrode of two different rows.

15. The memory array of claim 11, wherein the second electrode lines are offset from the first electrodes by approximately one half of the first pitch.

16. A memory array comprising:
    a plurality of first electrodes arranged in a plurality of columns and a plurality of rows and having a first pitch along a row direction and a second pitch along a column direction,
    a resistance variable material over the first electrodes;
    a plurality of second electrodes having a third pitch along the row direction and a fourth pitch along the column direction, each first electrode of each column being associated with a plurality of second electrodes to define a plurality of memory elements wherein each first electrode is addressable by each of the associated plurality of second electrodes.

17. The memory array of claim 16, wherein each second electrode is associated with at least one first electrode of two different rows.

18. The memory array of claim 16, wherein the second electrodes are offset from the first electrodes in the row direction by approximately one half of the first pitch and wherein the second electrodes are offset from the first electrodes in the column direction by approximately one half of the second pitch.

19. The memory array of claim 16, wherein the first and second pitches are greater than the third and fourth pitches.

* * * * *